(12) United States Patent
Hall et al.

(10) Patent No.: US 10,347,656 B2
(45) Date of Patent: Jul. 9, 2019

(54) SEMICONDUCTOR DEVICE AND MONOLITHIC SEMICONDUCTOR DEVICE INCLUDING A POWER SEMICONDUCTOR DEVICE AND A CONTROL CIRCUIT

(71) Applicant: SEMICONDUCTOR COMPONENTS INDUSTRIES, LLC, Phoenix, AZ (US)

(72) Inventors: Jefferson W. Hall, Chandler, AZ (US); Gordon M. Grivna, Mesa, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/644,613

(22) Filed: Jul. 7, 2017

(65) Prior Publication Data
US 2018/0019259 A1    Jan. 18, 2018

Related U.S. Application Data

(60) Provisional application No. 62/363,449, filed on Jul. 18, 2016.

(51) Int. Cl.
*H01L 29/78* (2006.01)
*H01L 21/768* (2006.01)
(Continued)

(52) U.S. Cl.
CPC .... *H01L 27/1203* (2013.01); *H01L 21/76275* (2013.01); *H01L 21/76283* (2013.01);
(Continued)

(58) Field of Classification Search
CPC ........... H01L 21/7683; H01L 21/76895; H01L 21/76275; H01L 23/628; H01L 27/1203;
(Continued)

(56) References Cited

U.S. PATENT DOCUMENTS

| 4,908,328 A | * | 3/1990 | Hu | ............. | H01L 21/76251 |
|---|---|---|---|---|---|
| | | | | | 148/DIG. 12 |
| 5,049,521 A | * | 9/1991 | Belanger | ............ | H01L 21/743 |
| | | | | | 257/E21.538 |

(Continued)

OTHER PUBLICATIONS

Jonishi et al., "A Breakthrough Concept of HVICs for High Negative Surge Immunity," Proceedings of the 27th International Symposium on Power Semiconductor Devices & IC's May 10-14, 2015, Kowloon Shangri-La, Hong Kong, IEEE, pp. 57-60.

(Continued)

*Primary Examiner* — Galina G Yushina
(74) *Attorney, Agent, or Firm* — Abel Schillinger, LLP

(57) ABSTRACT

A monolithic semiconductor device has a substrate with a power region and control region. The substrate can be a silicon-on-insulator substrate. An opening is formed in the power region and extends partially through the substrate. A semiconductor material is formed within the opening. A power semiconductor device, such as a vertical power transistor, is formed within the semiconductor material. A control logic circuit is formed in the control region. A first isolation trench is formed in the power region to isolate the power semiconductor device and control logic circuit. A second isolation trench is formed in the control region to isolate a first control logic circuit from a second control logic circuit. An interconnect structure is formed over the power region and control region to provide electrical interconnect between the control logic circuit and power semiconductor device. A termination trench is formed in the power region.

20 Claims, 26 Drawing Sheets

(51) Int. Cl.
 H01L 29/06 (2006.01)
 H01L 27/12 (2006.01)
 H01L 21/762 (2006.01)
 H01L 21/84 (2006.01)
 H01L 23/528 (2006.01)
 H01L 29/40 (2006.01)
 H01L 29/66 (2006.01)

(52) U.S. Cl.
 CPC ........ *H01L 21/76895* (2013.01); *H01L 21/84* (2013.01); *H01L 23/528* (2013.01); *H01L 29/0649* (2013.01); *H01L 29/407* (2013.01); *H01L 29/66712* (2013.01); *H01L 29/7811* (2013.01); *H01L 29/7813* (2013.01)

(58) Field of Classification Search
 CPC ............. H01L 29/66712; H01L 29/407; H01L 29/0649; H01L 29/7811; H01L 29/7813
 See application file for complete search history.

(56) References Cited

U.S. PATENT DOCUMENTS

| | | | |
|---|---|---|---|
| 6,531,754 B1 | 3/2003 | Nagano et al. | |
| 6,815,281 B1* | 11/2004 | Inoue | H01L 27/1052 257/E21.645 |
| 2002/0145446 A1* | 10/2002 | Aitouarab | H03K 3/356147 326/68 |
| 2003/0146488 A1* | 8/2003 | Nagano | H01L 21/76264 257/506 |
| 2003/0197240 A1* | 10/2003 | Ishihara | H01L 29/66674 257/500 |
| 2008/0122025 A1* | 5/2008 | Roggenbauer | H01L 21/76264 257/501 |
| 2008/0205133 A1* | 8/2008 | Gonzalez | G11C 11/405 365/185.01 |
| 2009/0127624 A1* | 5/2009 | Sumitomo | H01L 21/76243 257/350 |
| 2013/0181767 A1* | 7/2013 | Nakakuki | G11C 5/06 327/536 |

OTHER PUBLICATIONS

Kim et al., "Realization of Robust 600V High Side Gate Drive IC with a New Isolated Self-Shielding Structure," Proceedings of the 17 International Symposium on Power Semiconductor Devices & IC's May 23-26, 2005 Santa Barbara, CA, IEEE, pp. 1-4.

Yamaji et al., "A 600 V High-Voltage IC Technique With a New Self-Shielding Structure for High NoiseTolerance and Die Shrink," IEEE Transactions on Electron Devices, vol. 62, No. 5, May 2015, pp. 1524-1529.

Eric Coates; "Power Transistors and Heat Sinks"; obtained from archive.org; available online Jun. 26, 2017; pp. 1 to 4.

\* cited by examiner

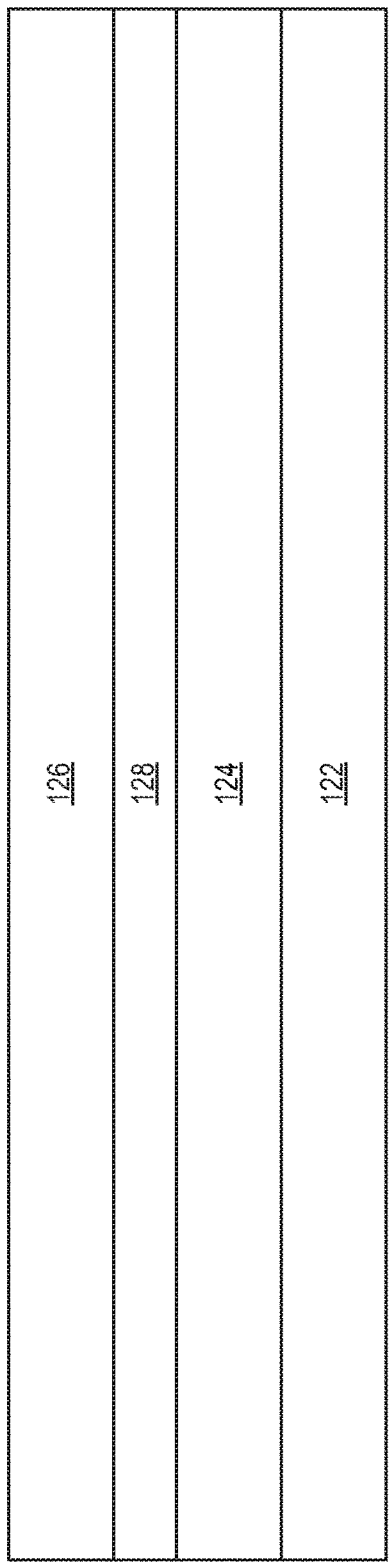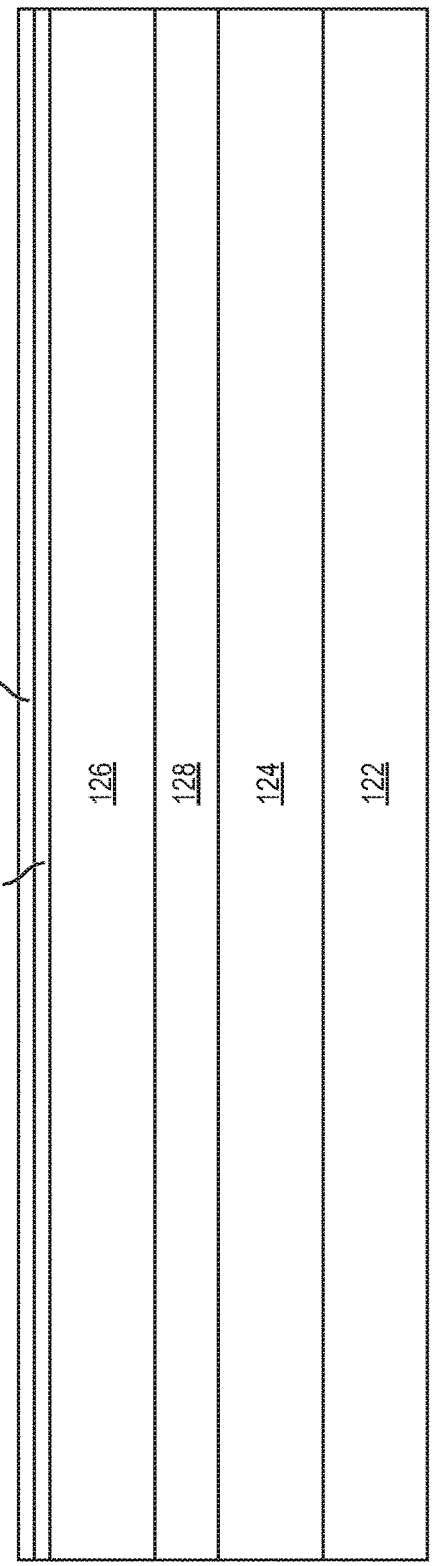

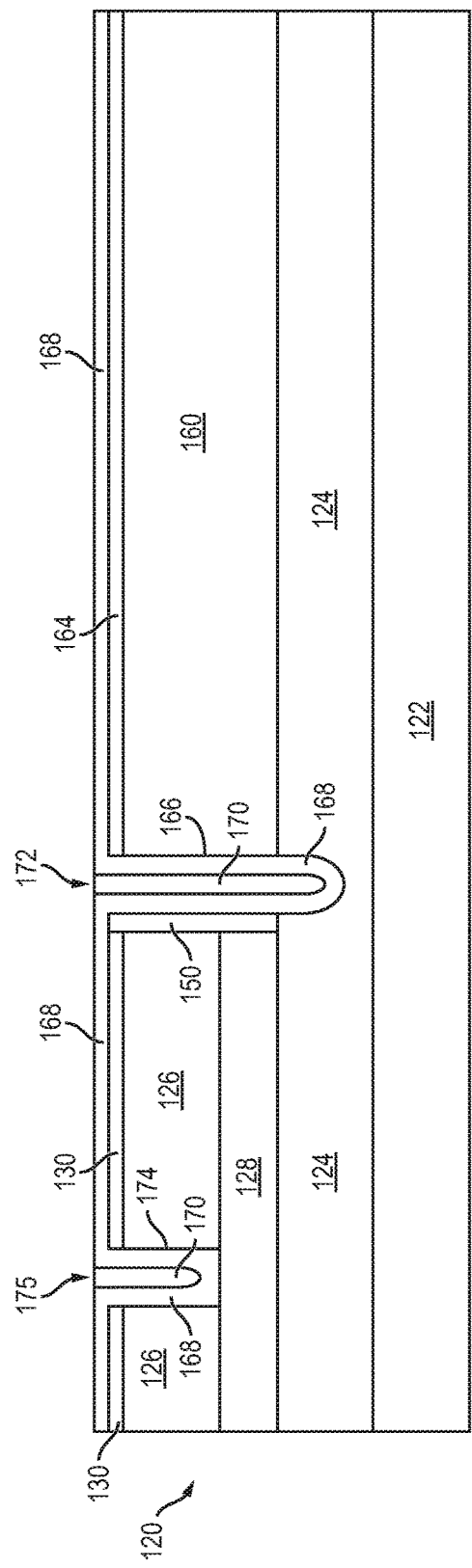
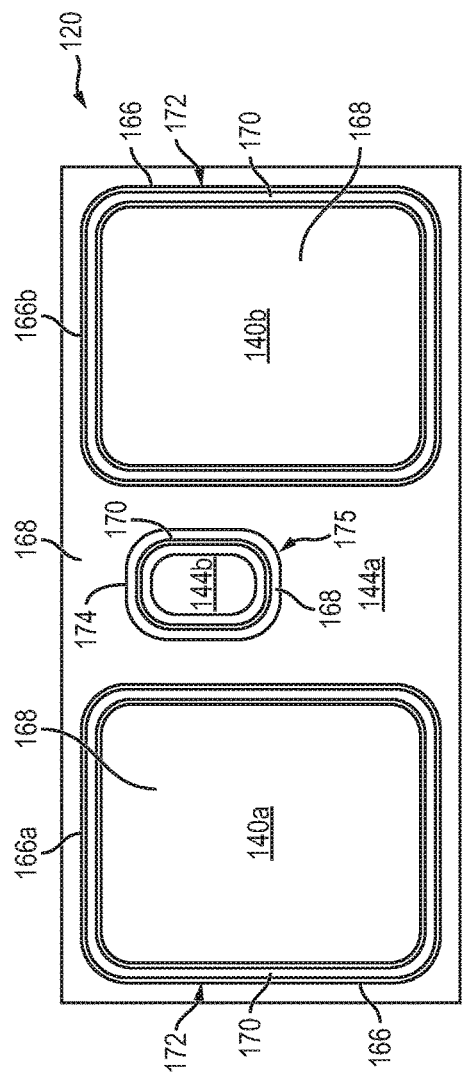
FIG. 2l
FIG. 2m

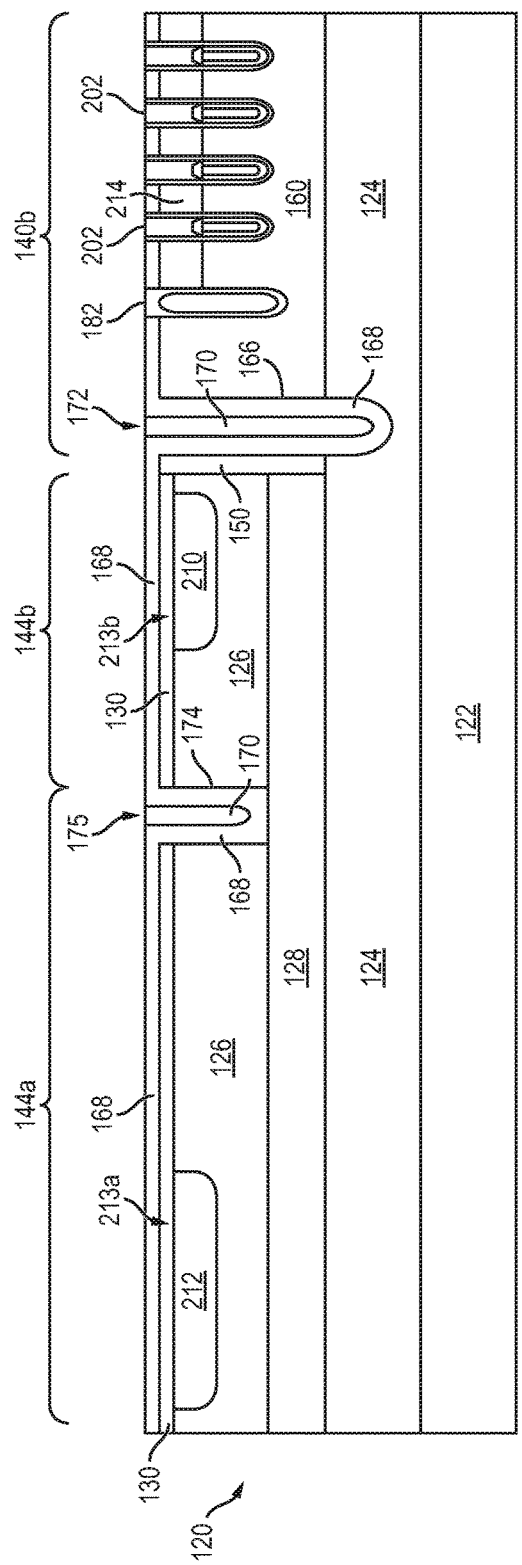
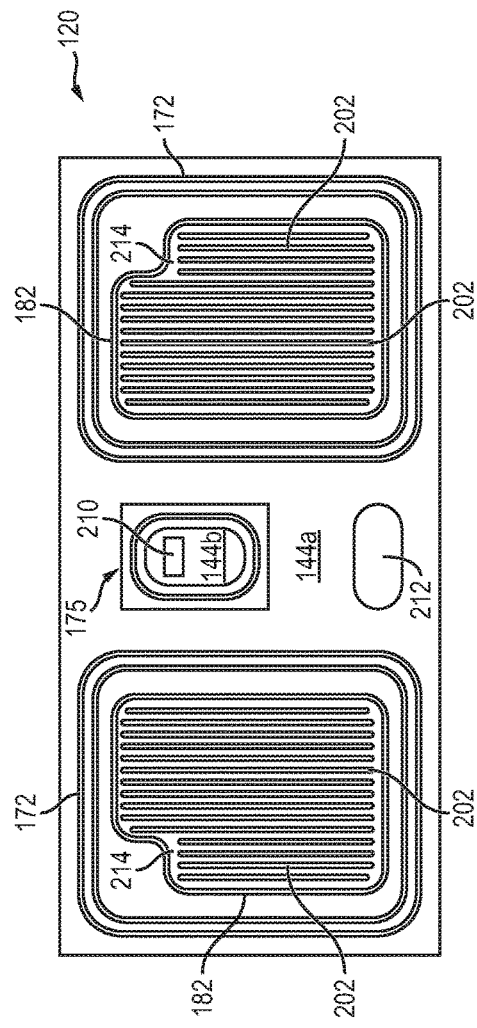
FIG. 4a
FIG. 4b

US 10,347,656 B2

SEMICONDUCTOR DEVICE AND MONOLITHIC SEMICONDUCTOR DEVICE INCLUDING A POWER SEMICONDUCTOR DEVICE AND A CONTROL CIRCUIT

CLAIM TO DOMESTIC PRIORITY

The present application claims the benefit of U.S. Provisional Application No. 62/363,449, filed Jul. 18, 2016, by Jefferson W. HALL and Gordon M. GRIVNA, which application is incorporated herein by reference.

FIELD OF THE INVENTION

The present invention relates in general to semiconductor devices and, more particularly, to a semiconductor device and method for a monolithically integrated power device and control logic.

BACKGROUND

A semiconductor wafer or substrate can be made with a variety of base substrate materials, such as silicon (Si), germanium, aluminum phosphide, aluminum arsenide, gallium arsenide (GaAs), gallium nitride (GaN), aluminum gallium nitride over gallium nitride (AlGaN/GaN), indium phosphide, silicon carbide (SiC), or other bulk material for structural support. A plurality of semiconductor die is formed on the wafer separated by a non-active, inter-die substrate area or saw street. The saw street provides cutting areas to singulate the semiconductor wafer into individual semiconductor die.

A power metal oxide semiconductor field effect transistor (MOSFET) is commonly used to switch relatively large currents. Many applications require several power MOSFETs, for example, to independently control electrical current in different loads. For instance, an automobile may require separate power MOSFETs to switch current through actuators that roll windows up and down, adjust rear-view mirrors, and adjust the position of car seats. Power MOSFETs may also be used to switch electrical current to heating elements within windows and mirrors, or as part of a switch-mode power supply to convert battery voltage to another voltage. In such applications, the electrical currents can be relatively high, leading to a need for high density, low loss switches resulting in high efficiency.

Each power device used to switch an electrical current requires control logic to determine when to turn the switch on and off. Commonly, the control logic for each power device is located in a control logic semiconductor package, and each of the power devices are separately packaged and placed on a common printed circuit board (PCB) or remotely from the control logic package. The plurality of separate semiconductor packages adds cost and consumes PCB area.

BRIEF DESCRIPTION OF THE DRAWING

FIGS. 4a-4f illustrate a process of forming control logic in the control region for the power MOSFET;

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 1A:
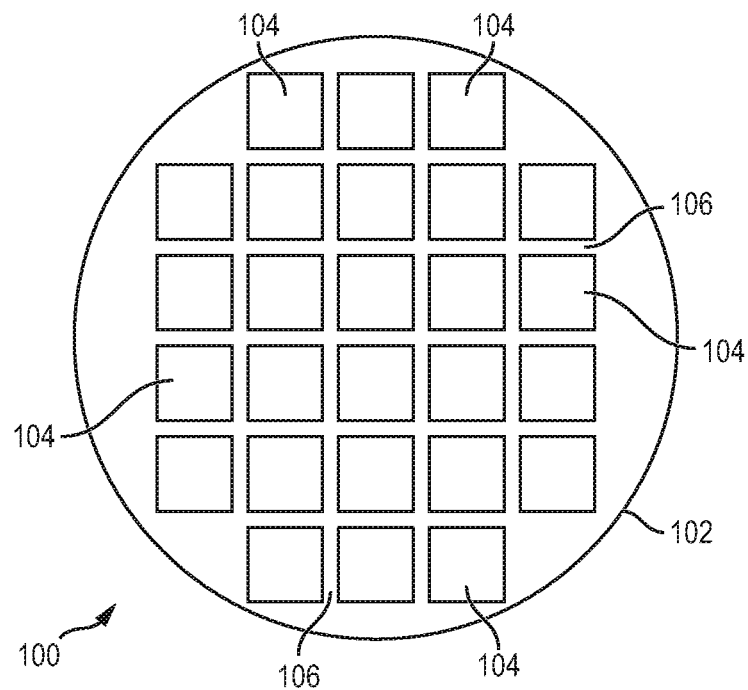
FIGS. 1a-1b illustrate a semiconductor substrate with a plurality of semiconductor die separated by a saw street.

FIG. 1a shows a semiconductor wafer or substrate 100 with a base substrate material 102, such as Si, germanium, aluminum phosphide, aluminum arsenide, GaAs, GaN, AlGaN/GaN, indium phosphide, SiC, or other bulk material for structural support. Semiconductor substrate 100 has a width or diameter of 100-450 millimeters (mm) and thickness of about 700-800 micrometers (μm). A plurality of semiconductor die 104 is formed on substrate 100 separated by a non-active, inter-die substrate area or saw street 106. Saw street 106 provides cutting areas to singulate semiconductor substrate 100 into individual semiconductor die 104.

Figure 1B:
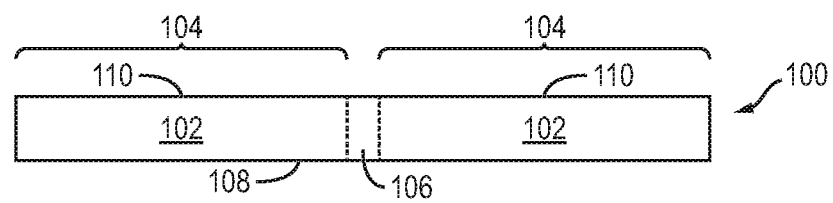

FIG. 1b shows a cross-sectional view of a portion of semiconductor substrate 100. Each semiconductor die 104 includes a back surface 108 and active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits. Semiconductor die 104 may also contain a power device, control logic, digital signal processor (DSP), microcontroller, ASIC, standard logic, amplifiers, clock management, memory, interface circuit, optoelectronics, and other signal processing circuits. Semiconductor die 104 may also contain integrated passive devices (IPDs), such as inductors, capacitors, and resistors, for RF signal processing. In particular, semiconductor die 104 contains one or more monolithically integrated vertically oriented power devices and associated control logic with relatively high density.

The following figures illustrate manufacturing high density power MOSFETs on a common die with control logic for switching the power MOSFETs. In FIG. 2a, silicon-on-insulator (SOI) substrate 120 includes a base substrate or handle wafer 122. Base substrate 122 is relatively heavily doped (N++) with donor dopant atoms. Donor dopant atoms provide an extra electron to the silicon lattice to provide a negative or N-type region. Acceptor dopant atoms create an electron hole in the silicon lattice to provide a positive or P-type region.

An N-type epitaxial (EPI) layer 124 can be grown on base substrate 122. Wafer 126 is relatively light doped with donor atoms. Wafer 126 and base substrate 122 each have an oxide layer grown on surfaces of the wafers. The oxide layers on wafer 126 and base substrate 122 are cleaned and atomically bonded to form buried oxide (BOX) layer 128. Base substrate 122 with EPI layer 124 bonded to wafer 126 through BOX layer 128 forms SOI substrate 120. In some embodiments, where a high voltage power MOSFET is formed, EPI layer 124 can be grown to a greater thickness. SOI substrate 120 de-couples the drain regions from the control logic regions.

Figure 2C:
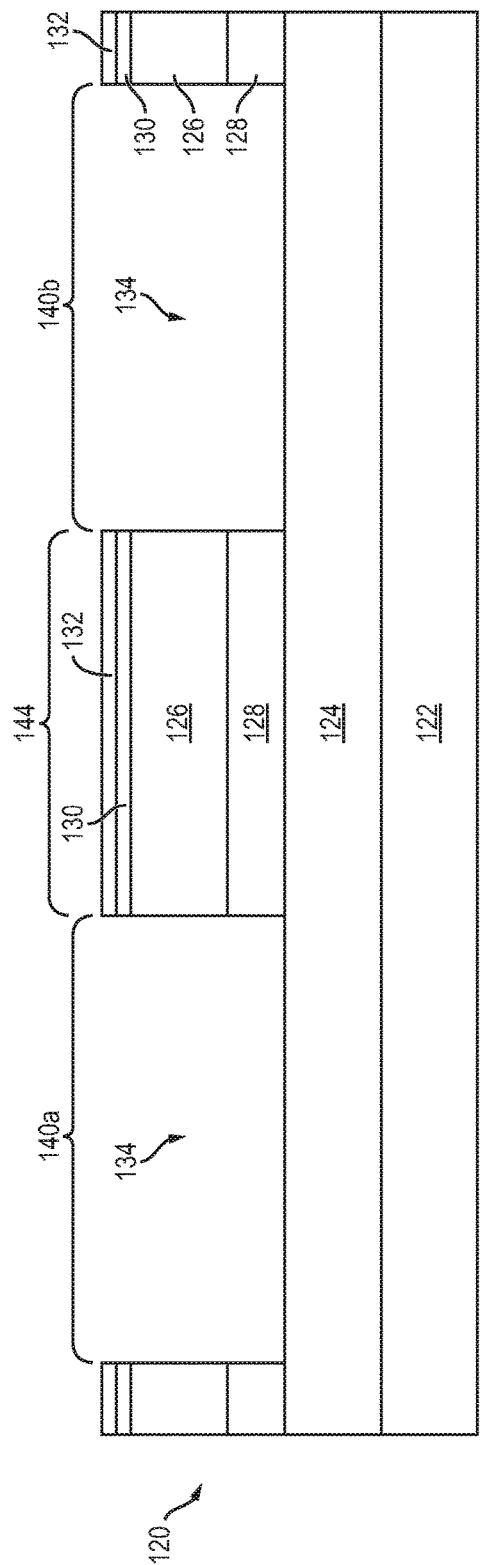
FIGS. 2a-2t illustrate a process of forming power regions and control regions in an SOI substrate.
Figure 2D:
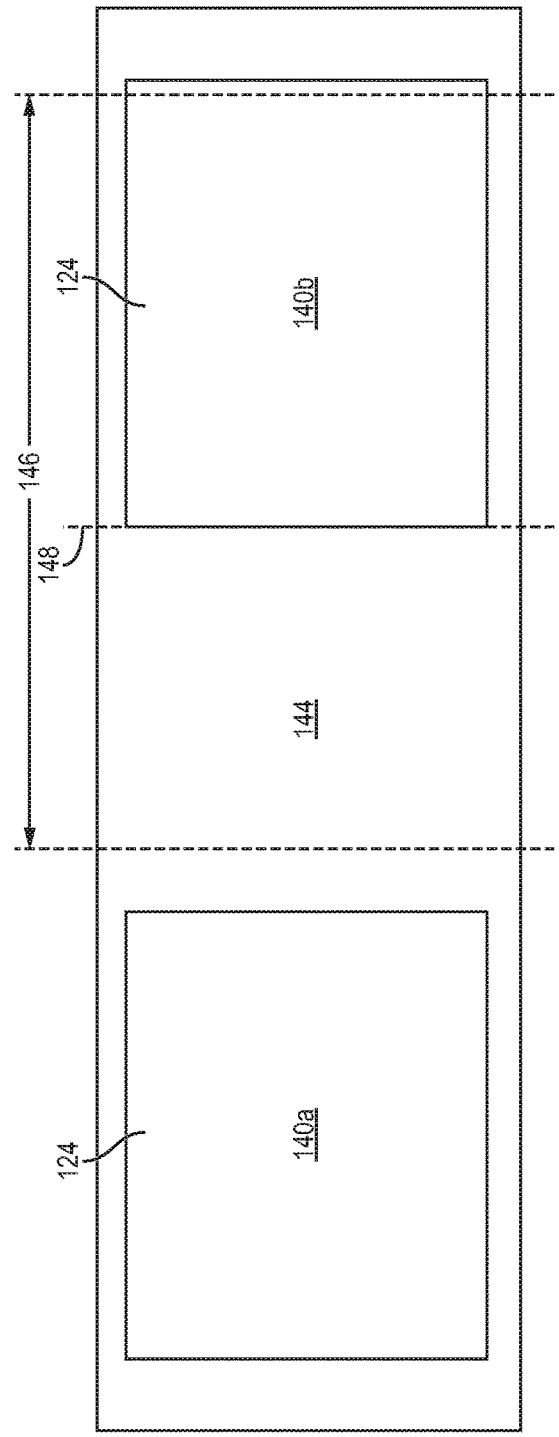

In FIG. 2b, an oxide layer 130 is formed over wafer 126 of SOI substrate 120. Nitride layer 132 is formed over oxide layer 130. A portion of wafer 126, BOX layer 128, oxide layer 130, and nitride layer 132 is removed in power regions 140a and 140b, as shown in FIG. 2c, to form openings 134 extending partially through SOI substrate 120. The layers are removed by laser direct ablation (LDA), plasma etching, or combination of etching process. Wafer 126, BOX layer 128, oxide layer 130, and nitride layer 132 remain within control region 144, as isolation for later formed control logic. FIG. 2d illustrates a plan view of SOI substrate 120 with power regions 140a and 140b separated by control region 144. Control region 144 can be centrally located with respect to power regions 140a and 140b, or disposed in any other location on semiconductor die 104. For example, control region 144 can be disposed at one or more locations around a perimeter of semiconductor die 104 and power regions 140a and 140b disposed central to control region.

Figure 2E:
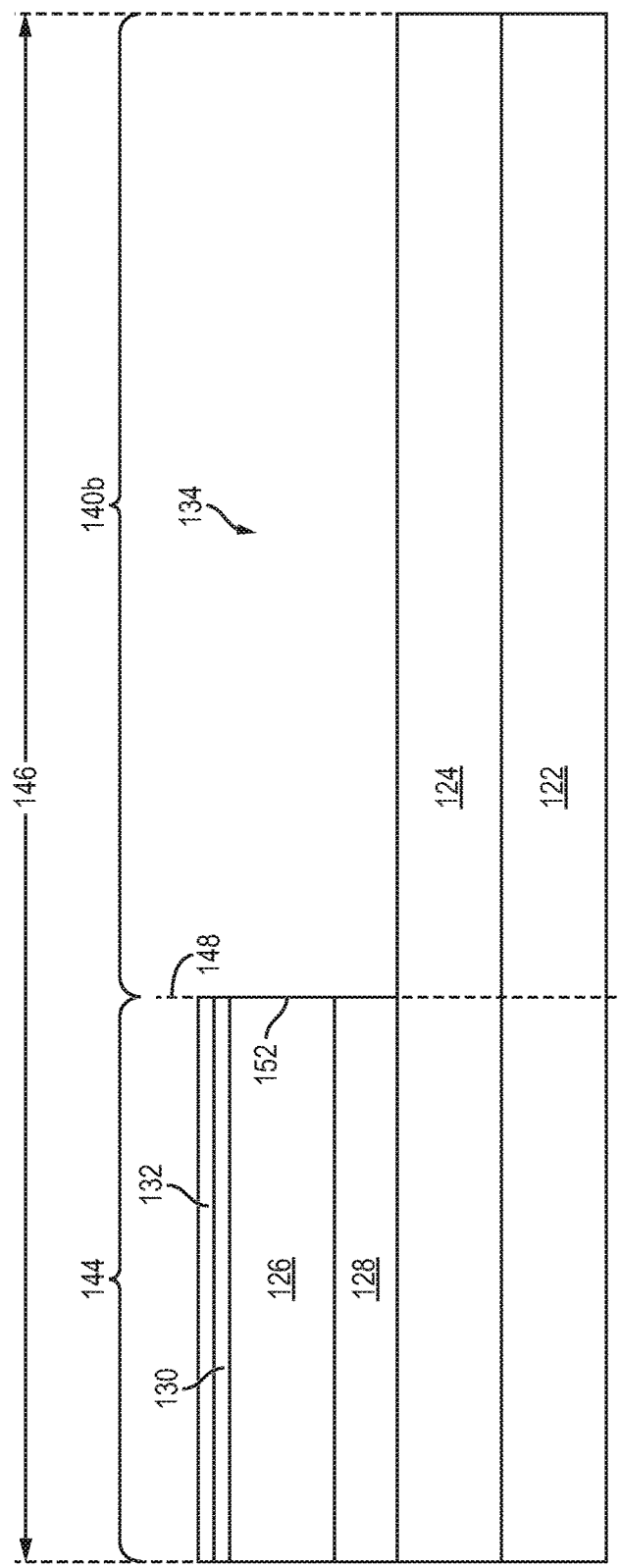

FIG. 2e illustrates a smaller portion 146 of SOI substrate 120 focused around boundary 148 between control region 144, where CMOS control logic is formed, and power region 140a or 140b, where vertical power MOSFETs are formed. While the disclosed examples illustrate the power devices as being vertical power MOSFETs, other power devices can be formed in power regions 140a and 140b. Semiconductor die 104 may have multiple power devices formed monolithically, each having accompanying control logic.

Figure 2F:
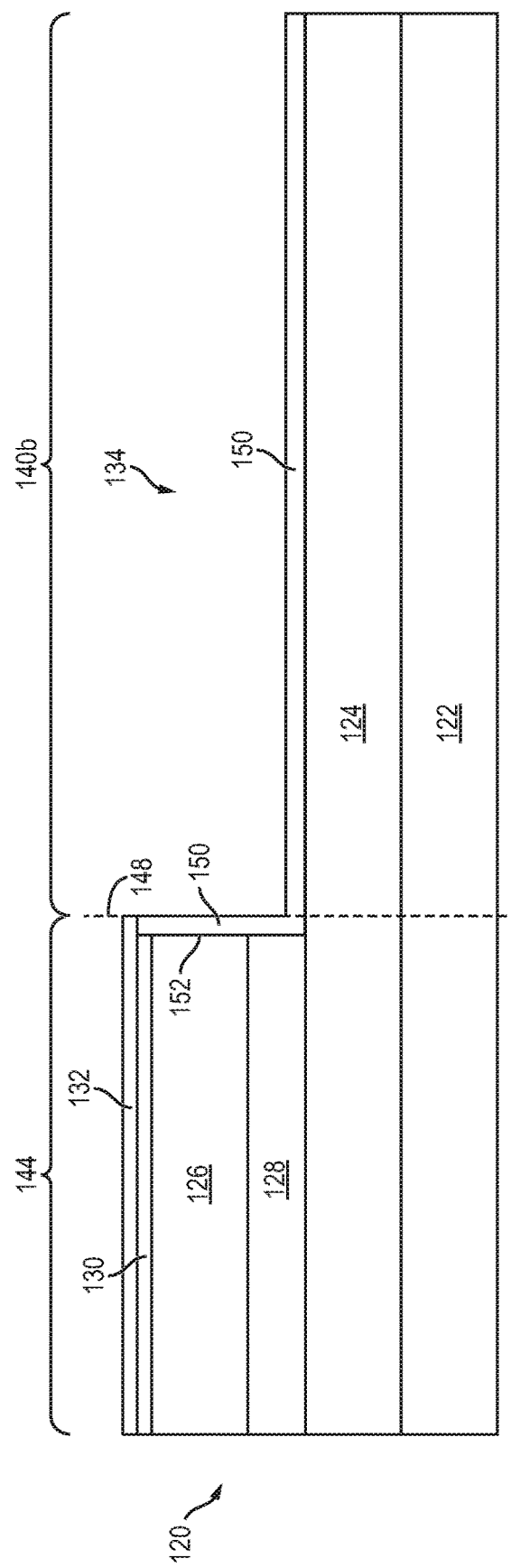
Figure 2G:
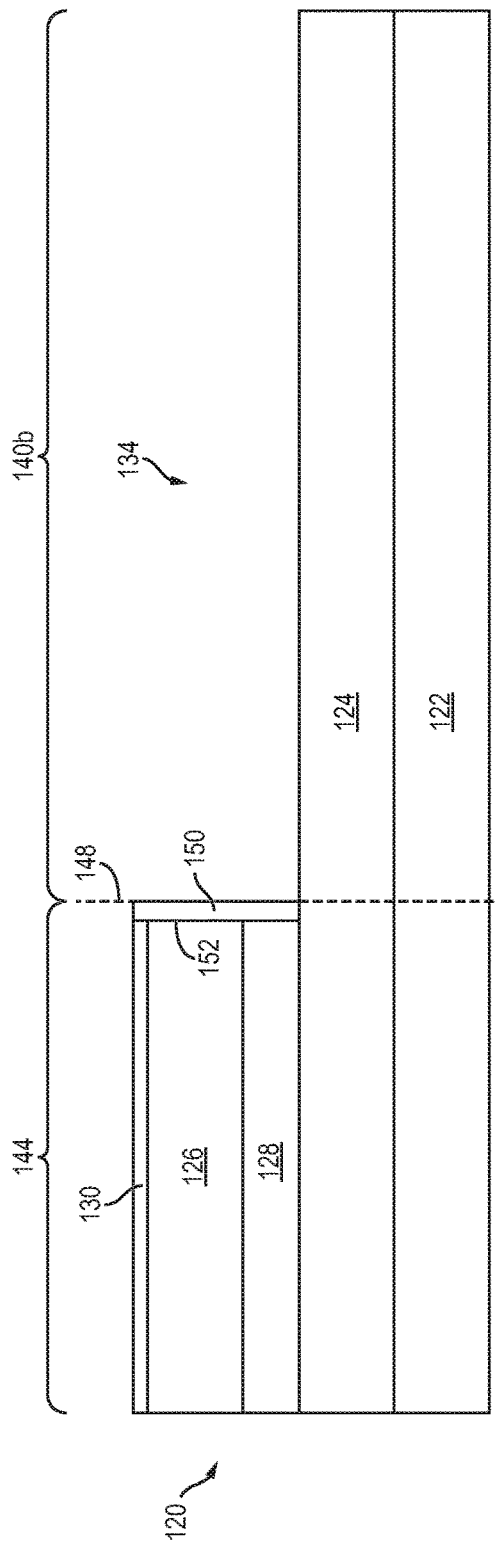
Figure 2H:
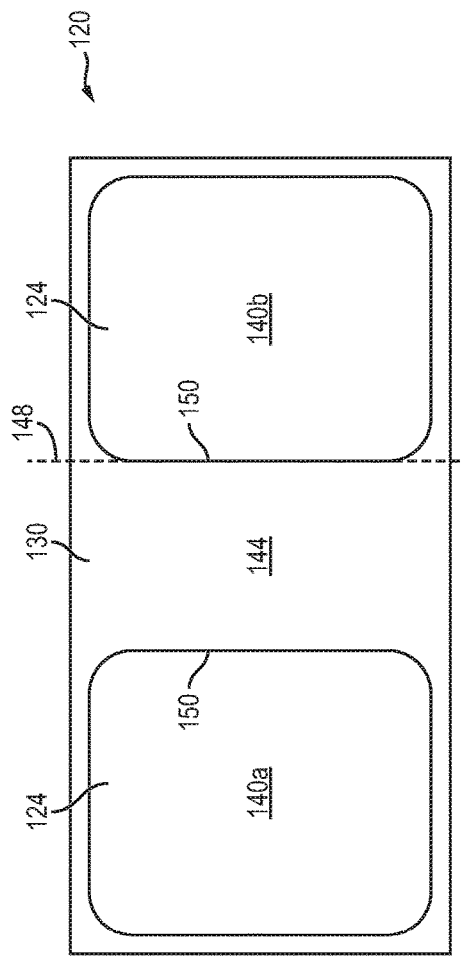

In FIG. 2f, an oxide layer 150 is formed to isolate sidewalls 152 of wafer 126 and BOX layer 128. Oxide layer 150 extends over EPI layer 124 in power regions 140a and 140b. FIG. 2f and subsequent figures continue to show the smaller portion 146 of SOI substrate 120 focused around boundary 148 between control region 144 and power region 140b, similar to FIG. 2e. In FIG. 2g, oxide layer 150 across EPI layer 124 in power regions 140a and 140b is removed by plasma etching or other etching process, leaving oxide layer 150 oriented vertically on sidewalls 152 of wafer 126 and BOX layer 128. Nitride layer 132 is removed by plasma etching or other etching process to expose oxide layer 130. FIG. 2h shows a plan view of SOI substrate 120 with power regions 140a and 140b and the remaining oxide layer 130 over control region 144.

Figure 2I:
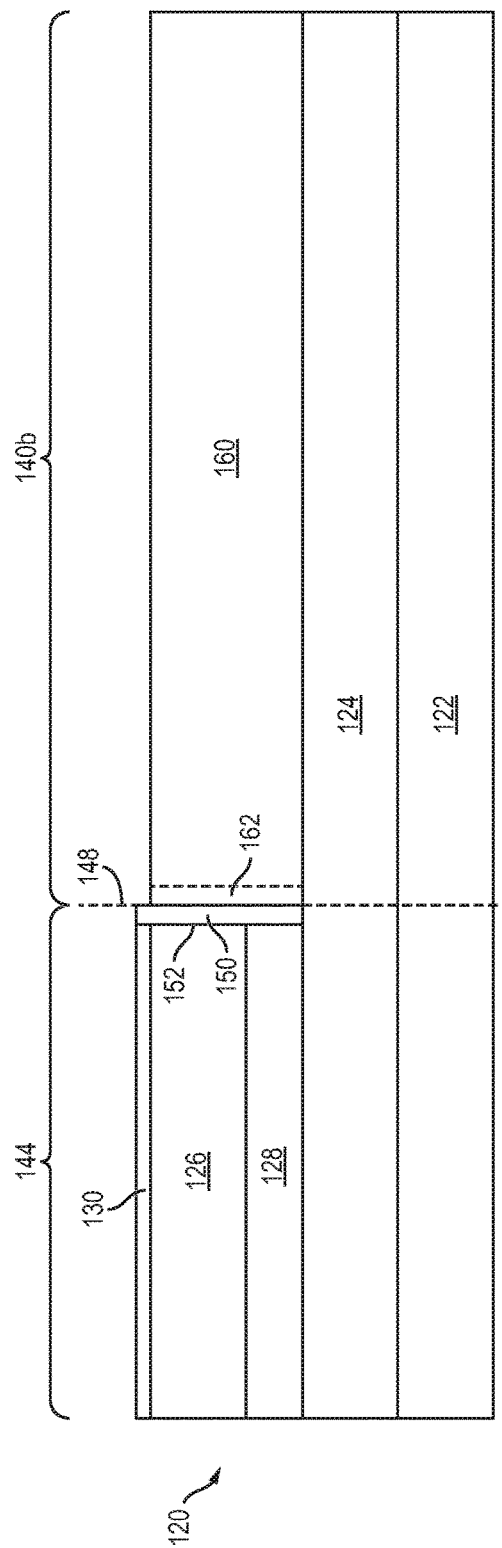
Figure 2J:
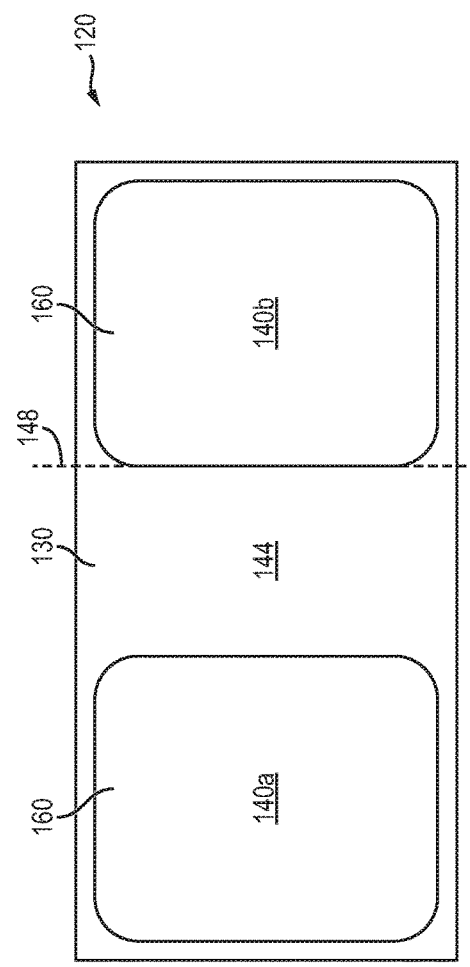

In FIG. 2i, a selective EPI growth is performed on EPI layer 124 of SOI substrate 120 to form EPI layer 160 within power regions 140a and 140b. Region 162 at the boundary between EPI layer 160 and oxide layer 150 typically contains defects in the atomic lattice. The selective EPI growth provides silicon with near perfect atomic lattice up from EPI layer 124, while leaving a relatively small region 162 of defects proximate to oxide layer 150. In some embodiments, EPI layer 160 has a different dopant atom concentration than wafer 126. The disclosed manufacturing process provides the flexibility of having various dopant concentrations, types of dopant, or dopant thicknesses between the multiple control region 144 and power regions 140a and 140b. Accordingly, each power device can be formed with a different doping profile by separate selective EPI growth steps using multiple masks. FIG. 2j shows a plan view of SOI substrate 120 with EPI layer 160 in power regions 140a and 140b.

Figure 2K:
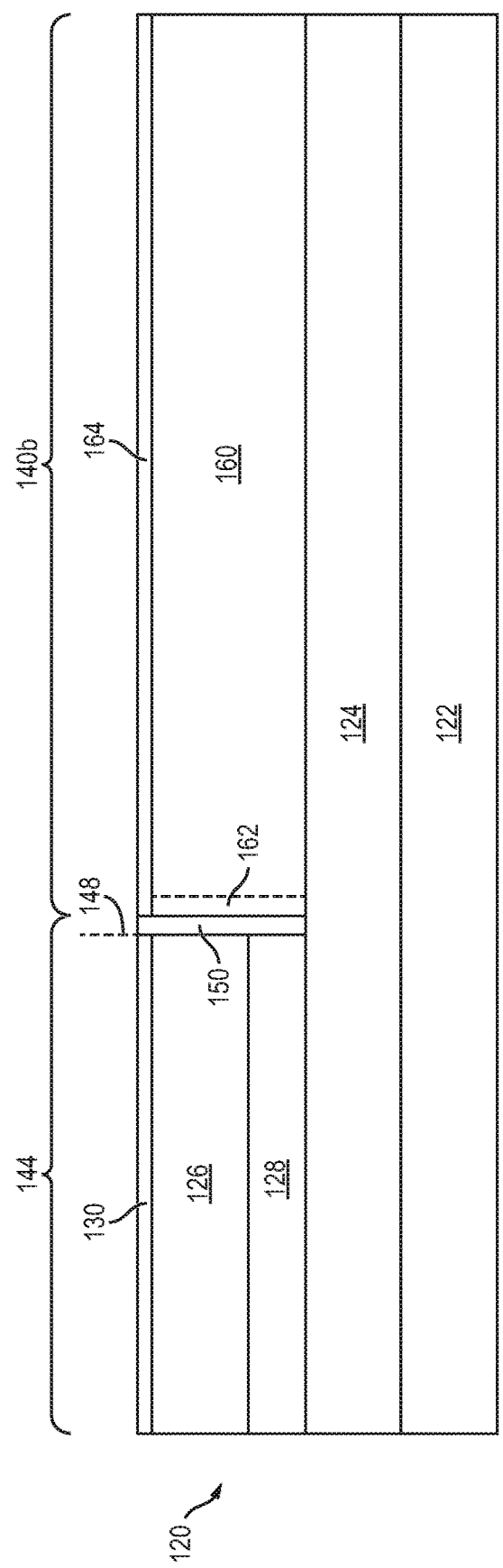

In FIG. 2k, pad oxide 164 is formed over EPI layer 160 in power regions 140a and 140b. In FIG. 2l, isolation trench 166 is formed around power regions 140a and 140b including through region 162 to remove imperfections where EPI layer 160 meets oxide layer 150. Isolation trench 166 has a ring, rectangular, or otherwise enclosing shape and extends through EPI layer 160 and partially into EPI layer 124. An oxide layer 168 is conformally applied over EPI layer 160 in power regions 140a and 140b and over oxide layer 130 in control region 144 and further on the sidewall of isolation trench 166. A polysilicon material 170 can be deposited in a remaining portion of isolation trench 166 over oxide layer 168 to form isolation structure 172 in power regions 140a and 140b. Alternatively, isolation trench 166 is filled with oxide layer 168. Isolation structure 172 isolates power devices in power regions 140a and 140b from the control logic in control region 144.

An isolation trench 174 is formed in control region 144 to isolate control region 144a from control region 144b. Isolation trenches 166 and 174 can be formed by LDA, plasma etching, or other etching process. Isolation trench 174 has a ring, rectangular, or otherwise enclosing shape and extends through wafer 126 to BOX layer 128 in control region 144. Oxide layer 168 is conformally applied on the sidewall of isolation trench 174. Polysilicon material 170 can be deposited in a remaining portion of isolation trench 174 over oxide layer 168 to form isolation structure 175 in control region 144. Alternatively, isolation trench 174 is filled with oxide layer 168 or other dielectric. Isolation trench 174 isolates control logic between multiple power devices in control regions 144a and 144b. FIG. 2m shows a plan view of SOI substrate 120 with isolation trenches 166 and 174 and oxide layer 168.

Figure 2N:
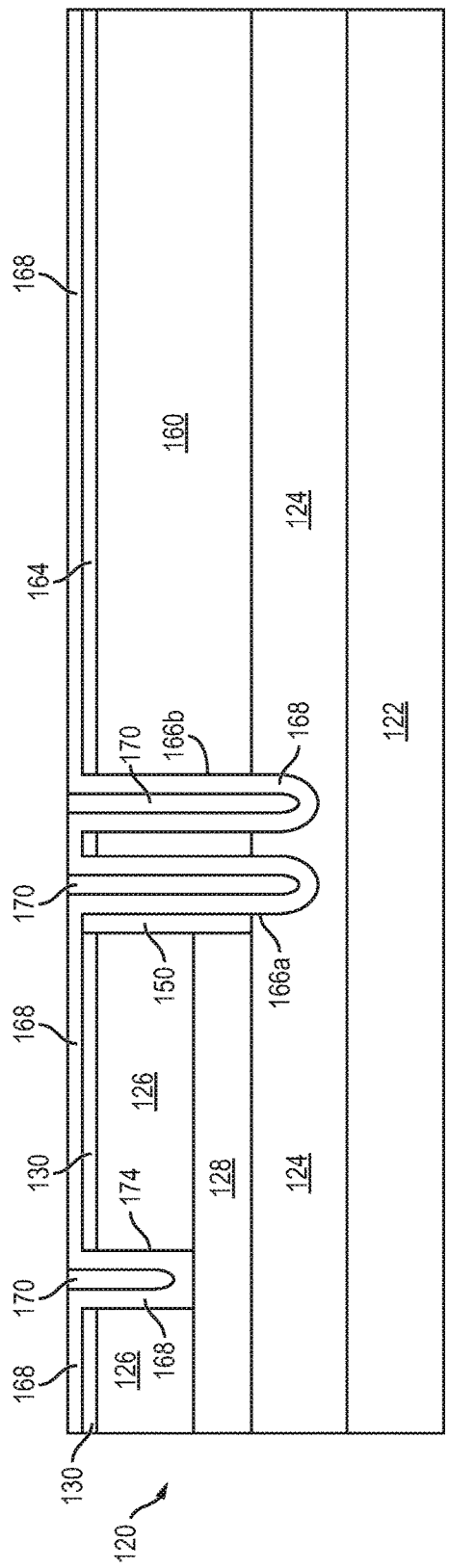
Figure 2O:
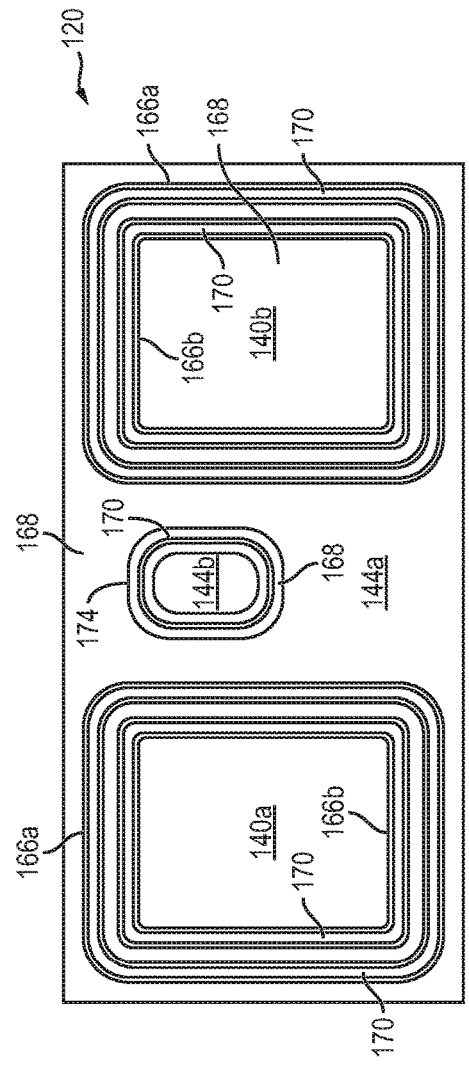

Additional isolation trenches 166 can be used with more power devices monolithically integrated on a common SOI substrate 120. In some embodiments, wider isolation regions or multiple concentric trench rings 166a and 166b in FIGS. 2n and 2o are formed where additional isolation is desired, e.g., for high voltage termination.

Figure 2P:
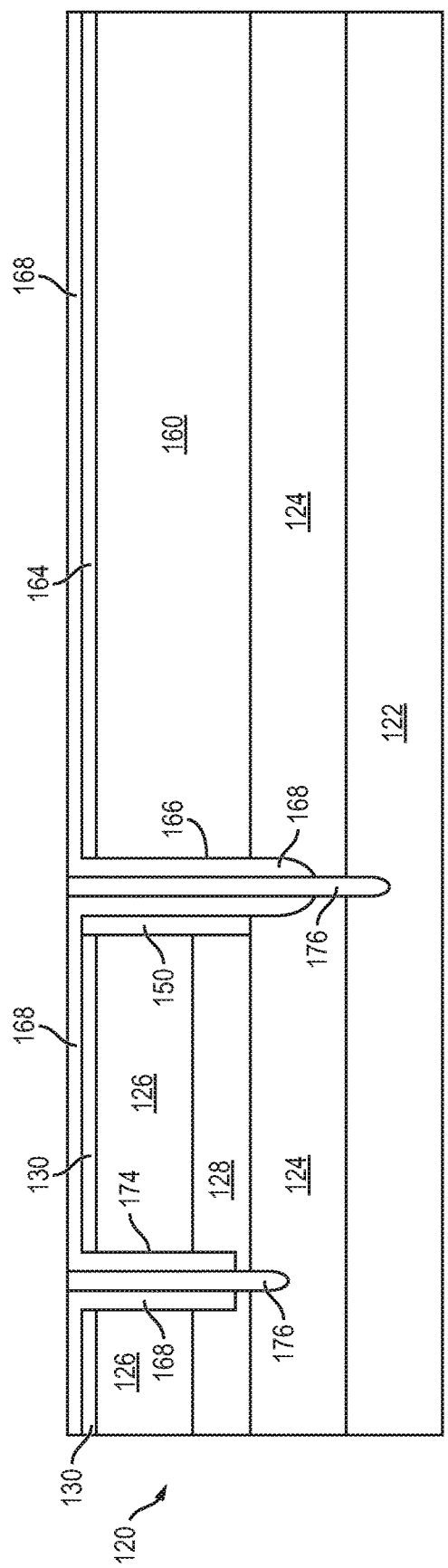
Figure 2Q:
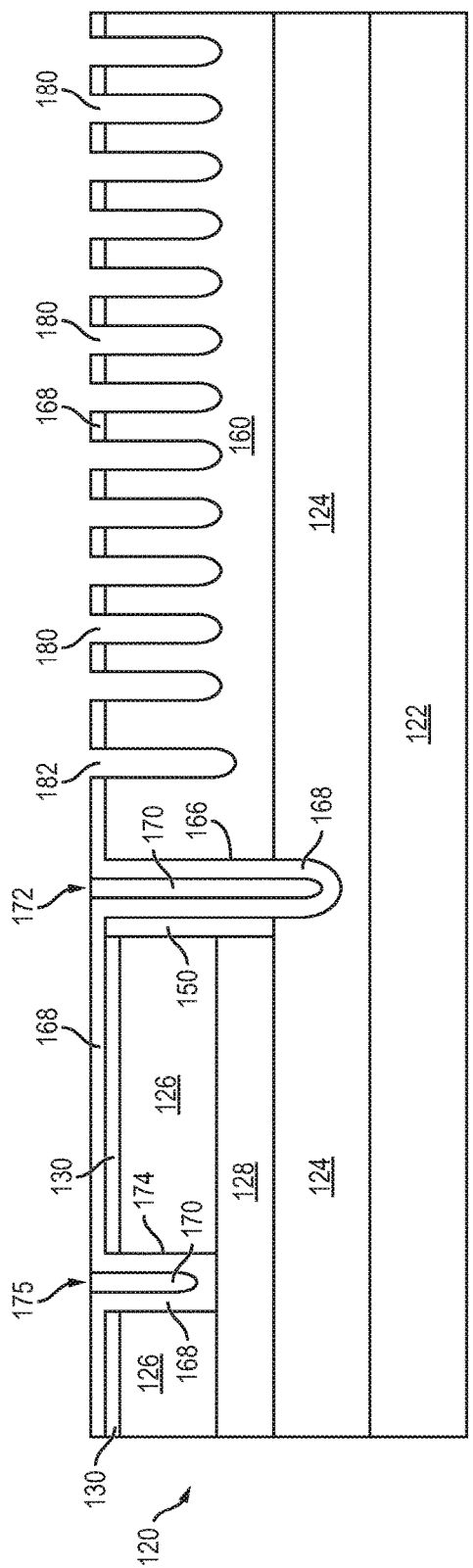

FIG. 2p show an alternate embodiment with isolation trench 166 formed similar to FIG. 2l followed by a deeper oxide spacer etch extending into base substrate 122. Likewise, isolation trench 174 is formed similar to FIG. 2l followed by a deeper oxide spacer etch extending into base substrate EPI layer 124. The oxide spacer etch is filled with phosphorous doped polysilicon 176 to create a conductive channel from the top surface of SOI substrate 120 to base substrate 122 in power regions 140a and 140b, and further create a conductive channel from the top surface of SOI substrate 120 to EPI layer 124 in control region 144a and 144b. Polysilicon 176 extending into base substrate 122 and EPI layer 124 provides a top surface connection to the power device substrates that can be routed to control logic in control region 144 using metal routing. Polysilicon 176 allows control logic to sense the drain voltage of power devices in power regions 140a and 140b. For embodiments with higher drain voltages being sensed by control logic, additional trenches around polysilicon 176 may be formed.

Figure 2R:
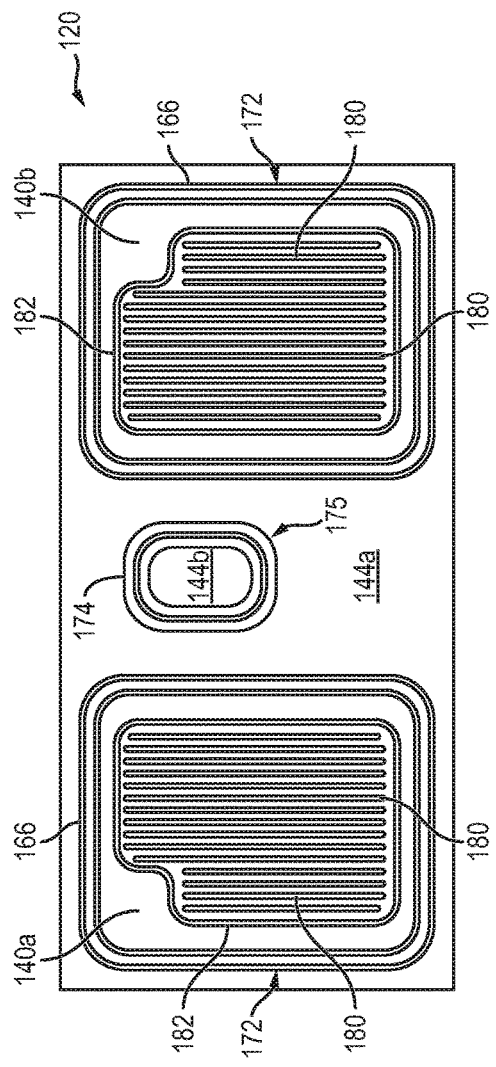

Returning to FIG. 2l, vertical gate trenches 180 are formed across power regions 140a and 140b, for example, in a parallel arrangement. A width $W_1$ of gate trenches 180 is about 0.3 µm. A width $W_2$ between gate trenches 180 is about 0.5 µm. A high voltage termination trench 182 is formed around gate trenches 180 of power regions 140a and 140b. FIG. 2r shows a plan view of SOI substrate 120 with gate trenches 180 and termination trench 182 around the gate trenches.

Figure 3A:
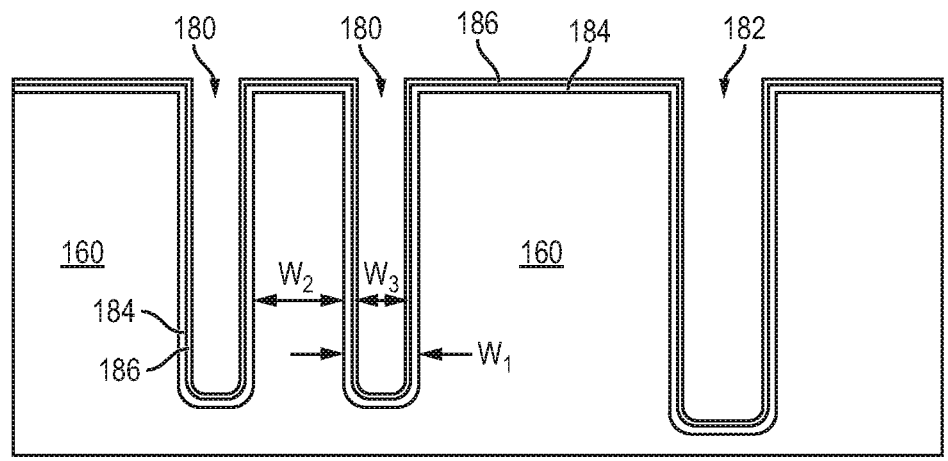
FIGS. 3a-3h illustrate a process of forming vertical gate structures in the power regions for the power MOSFET.
Figure 3B:
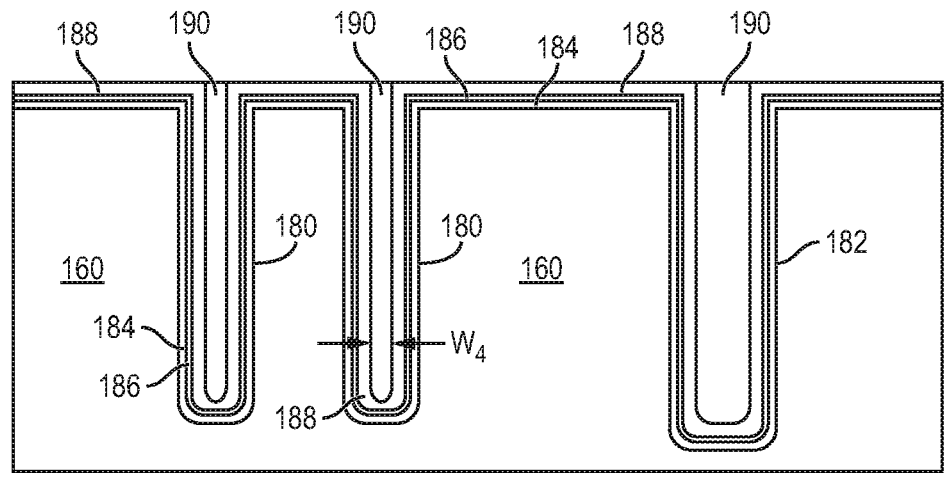

FIGS. 3a-3h illustrate further detail of forming vertical gate structures of the power MOSFET in gate trenches 180 and high voltage termination trench 182 in power regions 140a and 140b. In FIG. 3a, gate oxide layer 184 is conformally applied over EPI layer 160 and into gate trenches 180 and termination trench 182. Nitride layer 186 is conformally applied over gate oxide layer 184 on EPI layer 160 and into gate trenches 180 and termination trench 182. A width $W_3$ of the opening in gate trench 180 is about 0.16 µm after forming nitride layer 186. In FIG. 3b, an oxide layer 188 is conformally applied into gate trenches 180 and termination trench 182 over nitride layer 186. Phosphorous doped polysilicon 190 is deposited into gate trenches 180 to form field plates for the power MOSFET. A width $W_4$ of phosphorous doped polysilicon 190 in gate trenches 180 is about 0.1 µm. Phosphorous doped polysilicon 190 is also deposited into termination trench 182.

Figure 3C:
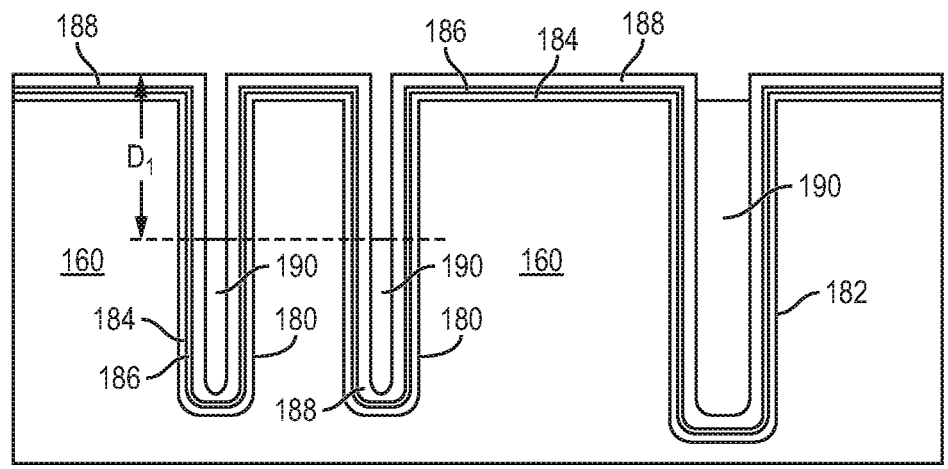
Figure 3D:
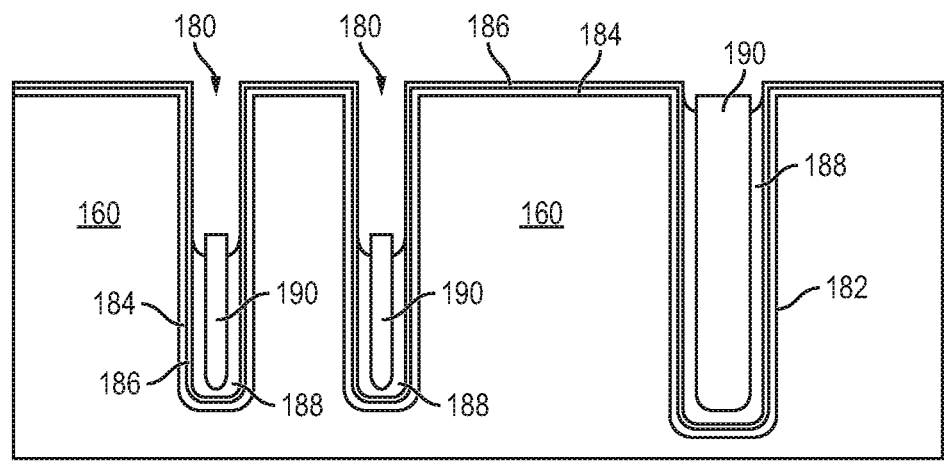
Figure 3E:
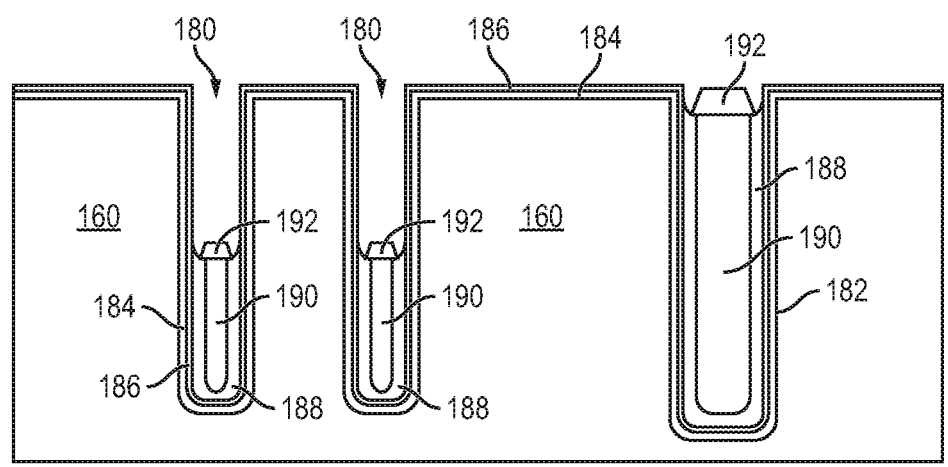
Figure 3F:
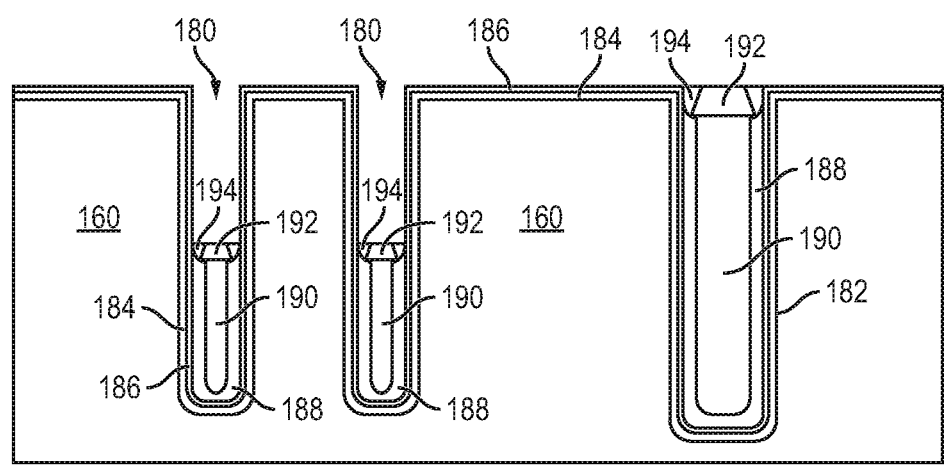
Figure 3G:
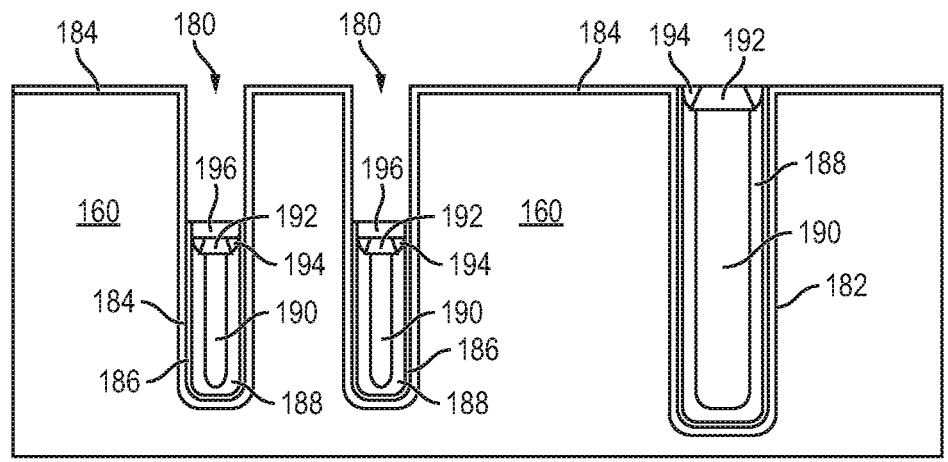
Figure 3H:
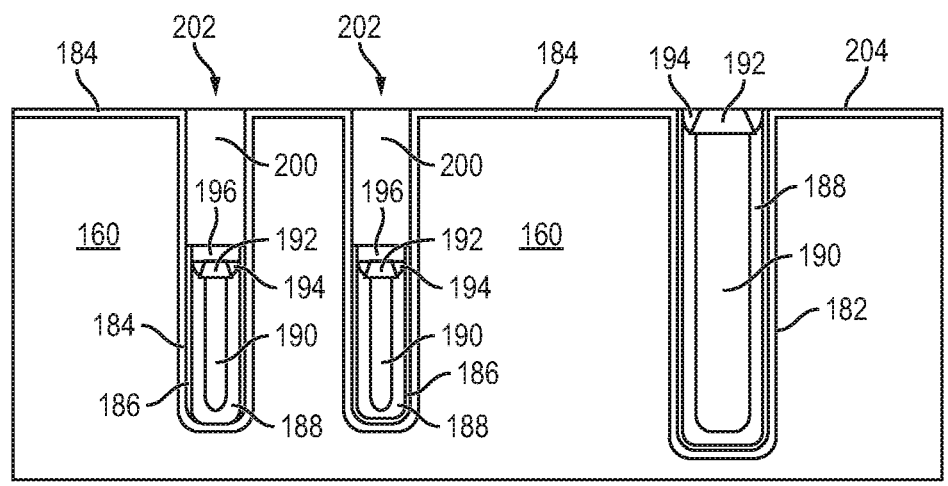

In FIG. 3c, a portion of polysilicon 190 in gate trenches 180 is removed by LDA, plasma etching, or other etching process to a depth D1 of 1.0 µm or less. A portion of polysilicon 190 in termination trench 182 is also removed by LDA, plasma etching, or other etching process. In FIG. 3d, a portion of oxide layer 188 is removed wet etching or other etching process down below polysilicon 190. An end portion of polysilicon 190 extends above the remaining oxide layer 188 in gate trenches 180 and termination trench 182 after the etching process. In FIG. 3e, oxide layer 192 is formed over the exposed end portion of polysilicon 190 in gate trenches 180 and termination trench 182. In FIG. 3f, oxide layer 194 is formed in gate trenches 180 and termination trench 182 to smooth the oxide over polysilicon 190. In FIG. 3g, the exposed portion of nitride layer 186 is removed by wet etching or other etching techniques. A high temperature oxide (HTO) layer 196 is formed over oxide layer 192, oxide layer 194, and gate oxide layer 184. In FIG. 3h, phosphorous doped polysilicon 200 is deposited to fill gate trenches 100 as vertical gate structures 202 of the power MOSFET. Surface 204 undergoes chemical-mechanical planarization or other removal technique.

Figure 2S:
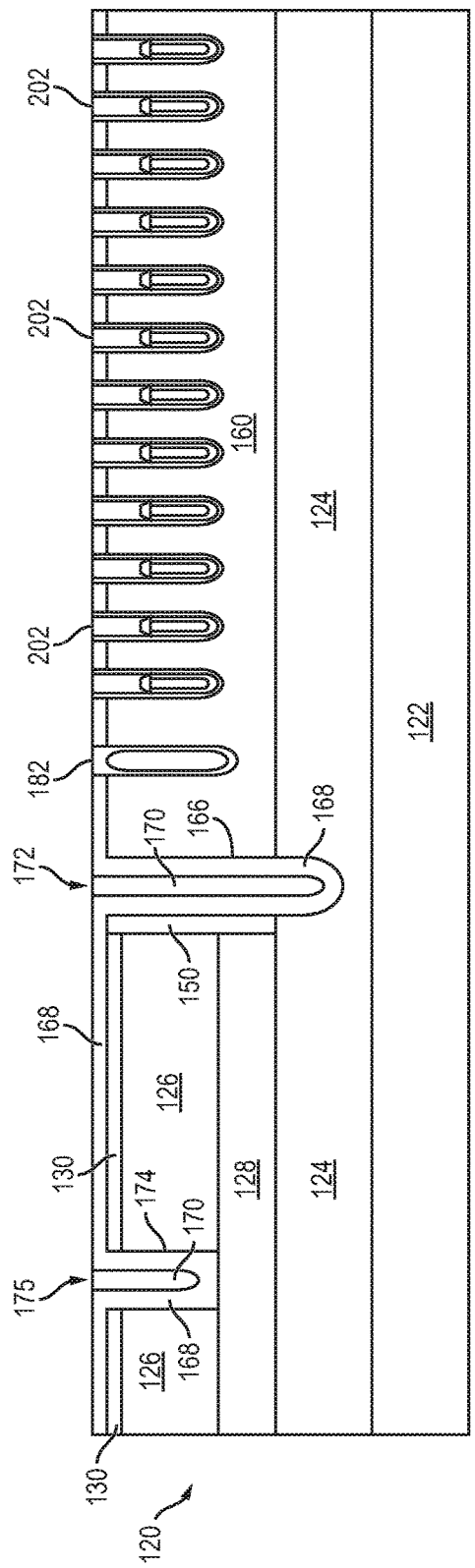
Figure 2T:
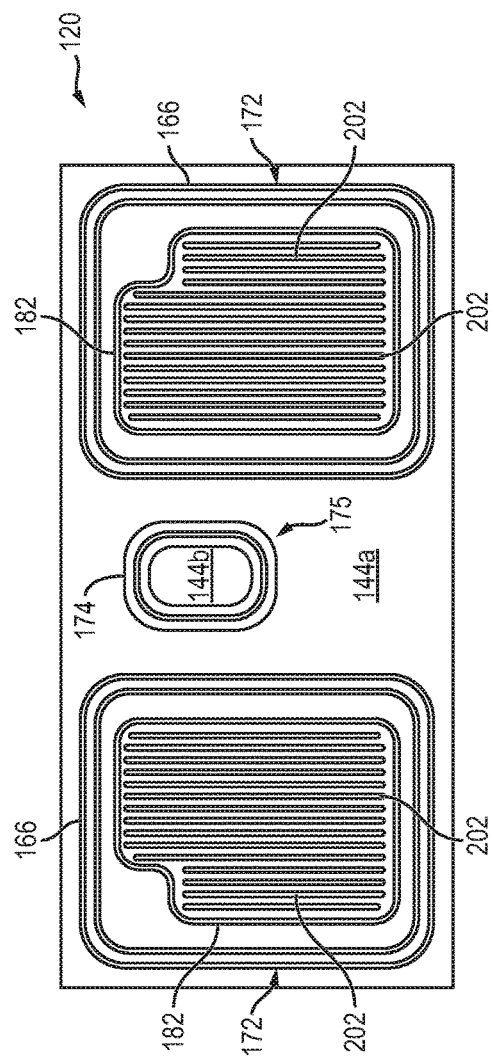

FIG. 2s shows SOI substrate 120 following formation of vertical gate structures 202 in FIGS. 3a-3h for the power MOSFET in power regions 140a and 140b. FIG. 2t shows a plan view of SOI substrate 120 with vertical gate structures 202 in power regions 140a and 140b. The power MOSFET is a high density vertical power semiconductor device.

Figure 4C:
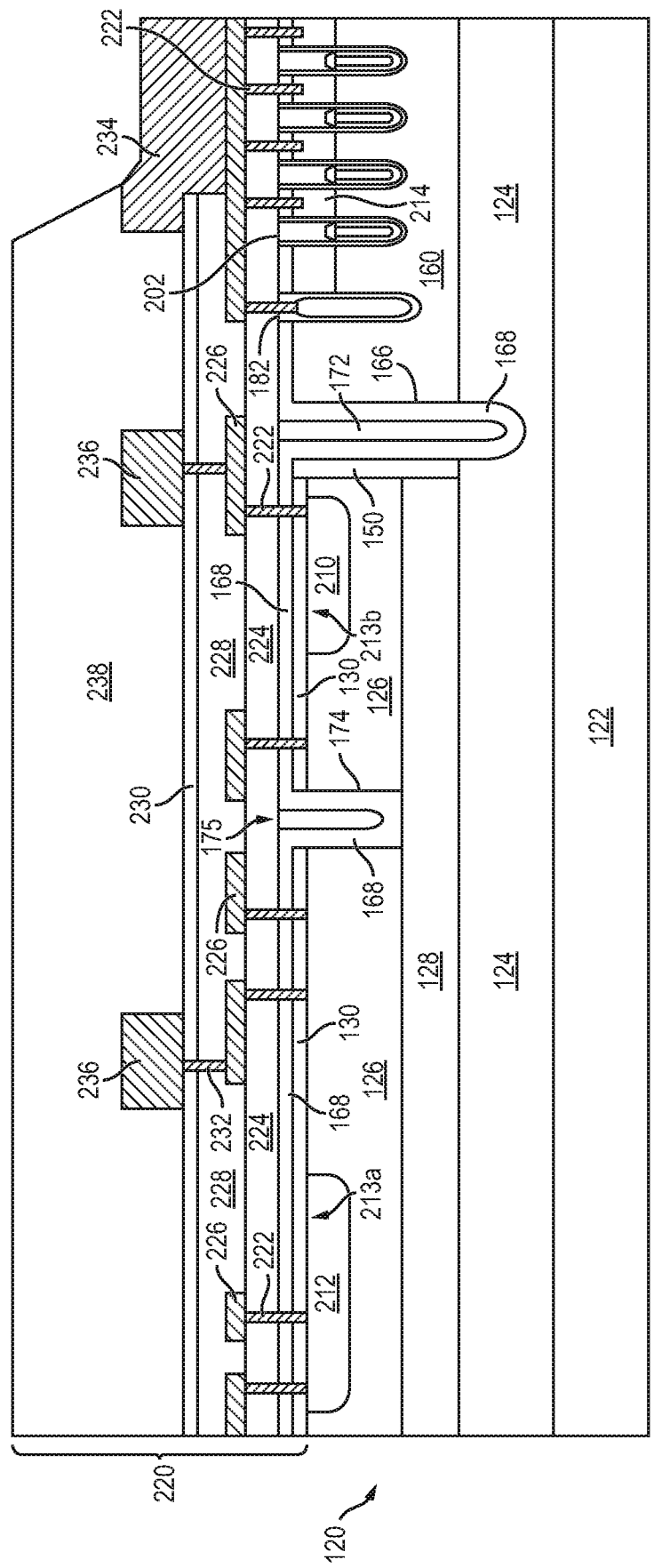

FIGS. 4a-4f show a process of forming complementary metal oxide semiconductor (CMOS) control logic in control regions 144a and 144b, and the doped regions of the power MOSFET in power regions 140a and 140b. SOI substrate 120 is oriented to show further detail of control regions 144a and 144b. In FIG. 4a, P-type well region 210 is formed in control region 144b of wafer 126, and P-type well region 212 is formed in control region 144a of wafer 126. One or more transistors are formed in wafer 126, including P-well regions 210 and 212, as control logic circuits 213a and 213b to achieve the requisite functionality in control of the power MOSFETs in power regions 140a and 140b. In some embodiments, other CMOS, bipolar, or DMOS analog and mixed signal transistors, as well as other discrete devices, are used to form control logic in control regions 144a and 144b of wafer 126.

A P-type region 214 is formed between gate structures 202 in power regions 140a and 140b. In some embodiments, a charge balanced superjunction can be used. FIG. 4b shows a plan view of SOI substrate 120 with P-type well region 210 formed in control region 144b of wafer 126, P-type well region 212 formed in control region 144a for various control logic transistors, and P-type region 214 is formed between gate structures 202 in power regions 140a and 140b.

In FIG. 4c, an interconnect structure 220 is formed over SOI substrate 120. Interconnect structure 220 includes conductive vias 222 formed through insulating layer 224 to connect to control logic transistors formed in control regions 144a and 144b. Conductive vias 222 further connect to P-type region 214 and gate structures 202 in power regions 140a and 140b. Conductive layer 226 is formed over insulating layer 224 and conductive vias 222. Insulating layer 228 is formed over conductive layers 226 and insulating layer 224. Conductive layer 226 and conductive vias 222 provide electrical interconnect for control circuits 213a and 213b to control the power devices in control regions 140a and 140b. Additional insulating layers like 230, conductive layer 226, and conductive via 232 can be formed for electrical interconnect and routing.

Conductive plug 234 operates as a front-side source contact through conductive vias 222 to the power MOSFET in power regions 140a and 140b and is configured for a leadframe to be coupled to the source of the power MOSFET by a clip, bond wire, or other appropriate mechanism. Conductive layer 236 routes electrical signals from the control logic in control regions 144a and 144b to contact pads for connection to the leadframe by wire bonding or other appropriate connection method. Insulating layer or encapsulant 238 is formed over conductive layer 236 and conductive plug 234 for environmental protection and structural integrity. An opening is etched through insulating layer 238 to expose conductive plug 234 and contact pads of conductive layer 236 for subsequent interconnect.

Figure 4D:
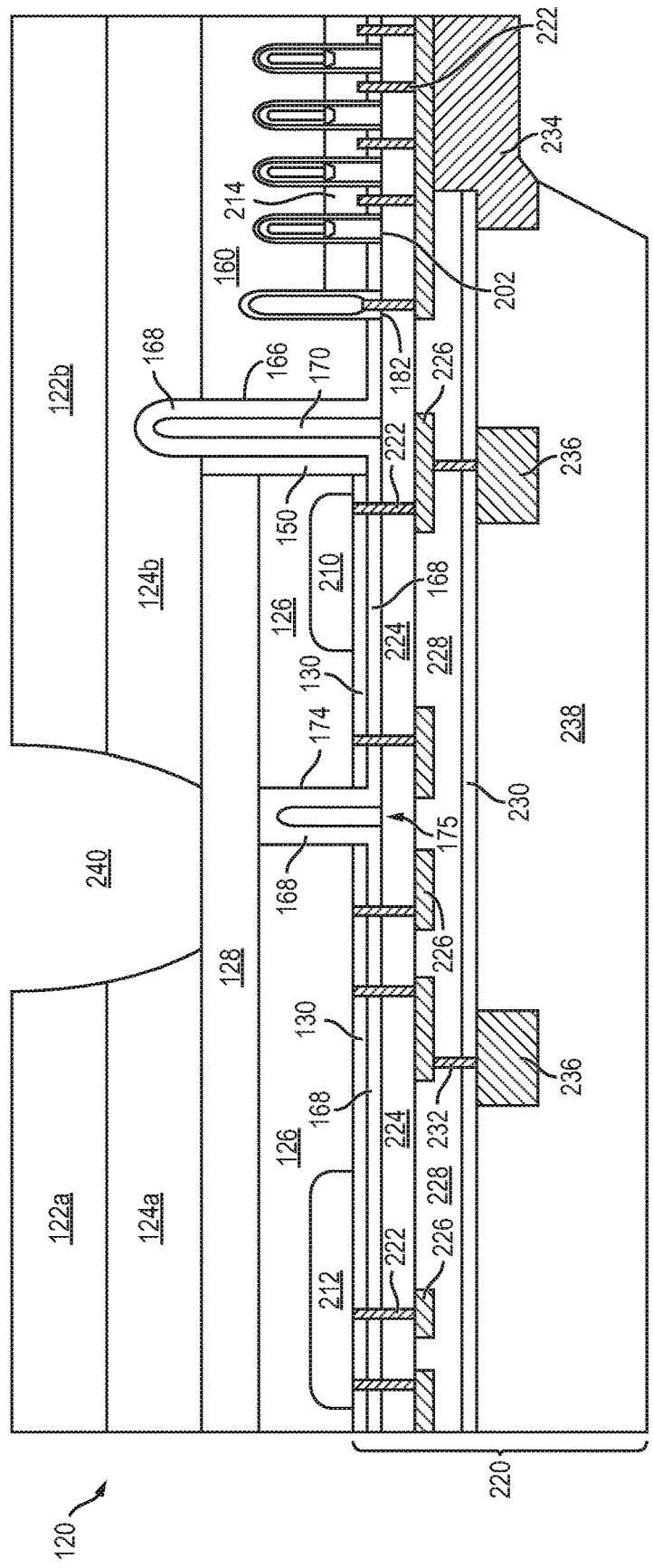

In FIG. 4d, SOI substrate 120 is shown inverted to form trench 240 with backside etching through base substrate 122 and EPI layer 124. In one embodiment, plasma etching is used to form trench 240. Trench 240 provides lateral isolation between the plurality of power regions 140 and control regions 144 on SOI substrate 120. Trench 240 separates base substrate 122 into a portion 122a connected to the drain of a power MOSFET formed in power region 140a, and a portion 122b connected to the drain of a power MOSFET formed in power region 140b. Accordingly, trench 240 provides isolation of the multiple drain regions on semiconductor die 104. EPI layer 124 is likewise separated into portions 124a and 124b. In some embodiments, an additional trench like 240 is formed between power region 140a and control region 144, such that the portion 122a of base substrate 122 is isolated from the power MOSFET in power region 140a and sits as an island over control region 144. Trench 240 can extend laterally to trench 166 such that base substrate 122 and EPI layer 124 remain directly over power region 140, and are completely removed over control region 144. However, base substrate 122 and EPI layer 124 remain extending over control region 144 to improve die strength and planarity of the wafer backside. Base substrate 122 extending over control region 144 also allows conductive vias to be formed through BOX layer 128 to couple the control logic circuitry to the respective power MOSFETs.

Figure 4E:
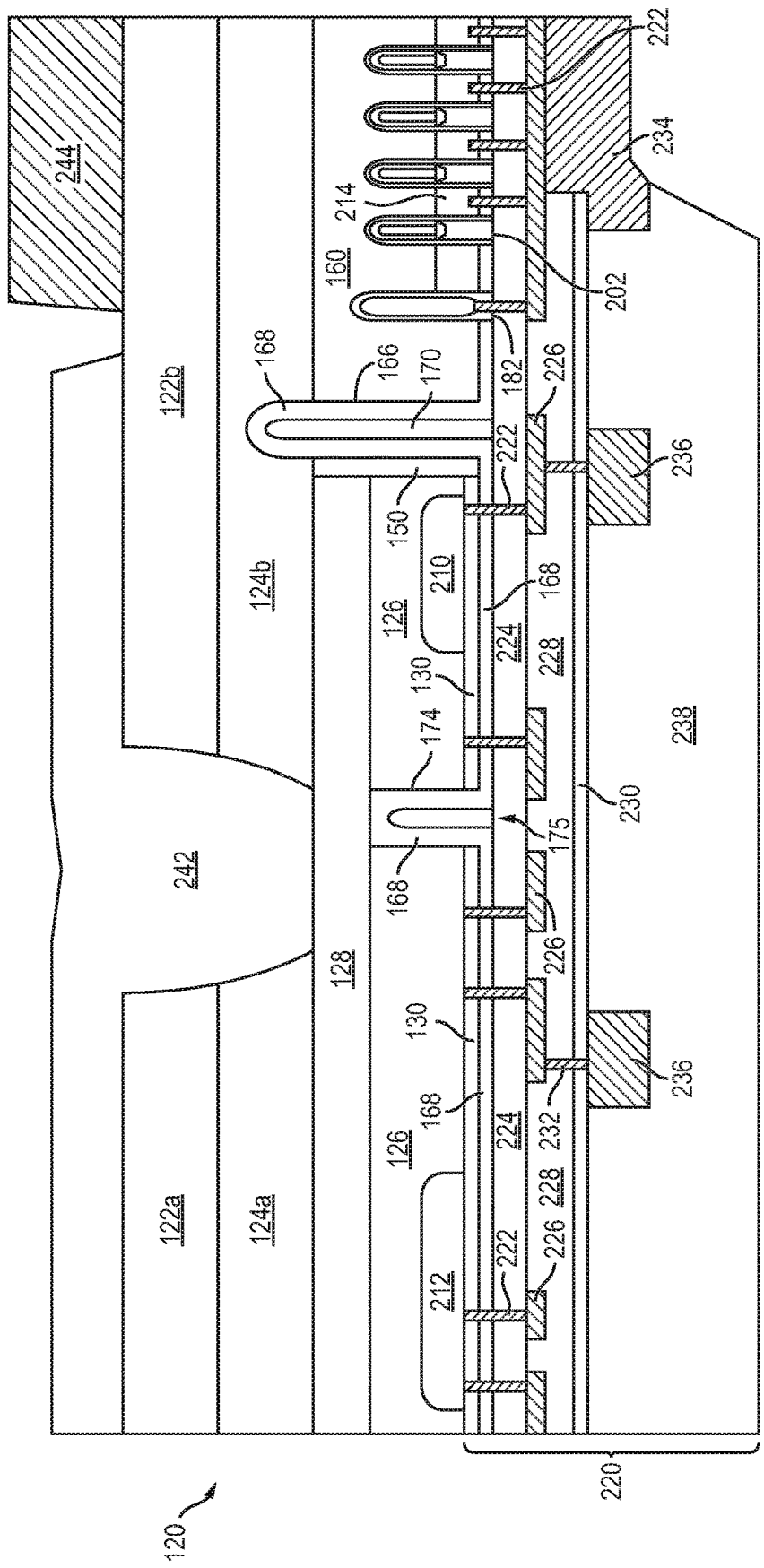
Figure 4F:
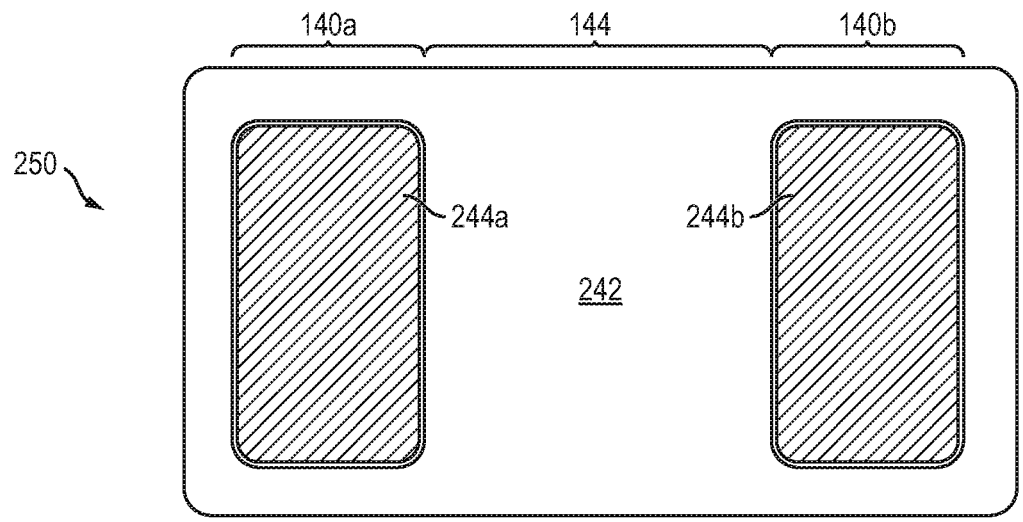

In FIG. 4e, an insulating or passivation layer 242 is formed over base substrate 122, including into trench 240. Insulating layer 242 includes openings over power regions 140 for the formation of drain contacts 244. FIG. 4f illustrates a plan view of semiconductor device 250 after formation of passivation layer 242 and drain contacts 244. Semiconductor device 250 includes two monolithically integrated vertical power MOSFETs formed in power regions 140a and 140b, and separately isolated analog, digital, or mixed signal control logic formed in control region 144 for each of the vertical power MOSFET. Each of the power devices can operate at a different voltage by varying the thickness of the EPI layers for the particular power devices, as well as varying the trench depth of the power devices.

Trench 240 surrounds power regions 140a and 140b and creates a lateral separation between portion 122a and portion 122b of base substrate 122. Trench 240 electrically isolates the drain terminal of a power MOSFET in power region 140a from the drain terminal of a power MOSFET in power region 140b. Vertical isolation between the control logic and power device drain terminals is provided by buried oxide layer 128. Portion 122a of base substrate 122 includes a branch that extends under control region 144a, and portion 122b extends under control region 144b, so that control logic is able to contact the drain of power MOSFETs formed in power region 140a using a conductive via through BOX layer 128. If a bonding wire is used to couple control region 144 to the drain leadframe contacts, or if no backside connection is required, base substrate 122 may be completely removed under control region 144. Removing additional material of base substrate 122 and EPI layer 124 under control region 144, or electrically isolating the material from all power devices, reduces interference in the control logic caused by the high voltage drain contacts.

Semiconductor device 250 is disposed on a leadframe and attached by metallurgical bonding between drain contacts 244 and the leadframe. A clip from the leadframe to source contacts 234 provides an external source contact for each of the vertical power MOSFETs. Likewise, drain contact 244 can be routed by bond wire or clip to the top surface of semiconductor device 250, e.g. for drain sensing. Bonding wires are used to couple other leadframe contacts to terminals of control region 144 for I/O of signals necessary for control of power MOSFETs formed in power regions 140a and 140b. Semiconductor device 250 is encapsulated electrical interconnect and singulated to finish the package.

Semiconductor device 250 combines one or more power devices and control logic fully isolated (source, drain, and gate of power MOSFET and control logic) in an integrated monolithic semiconductor package using an SOI substrate or non-SOI substrate. The power devices and control logic can be lateral or high density vertical trench-based semiconductor devices with vertical conduction path from active surface 110 to back surface 108 in semiconductor die 102. Conductive layers 226 and 236 provide electrical interconnect on a first major surface for control logic circuits 213a and 213b. Conductive layer 234 provides electrical interconnect on the first major surface for the power MOSFET, e.g. source connection. Conductive layer 244 provides electrical interconnect on a second major surface for the power MOSFET, e.g. drain connection. Semiconductor device 250 provides a flexible platform for different voltages based on vertical thickness and/or trench depth. Semiconductor device 250 containing one or more isolated power devices and associated control logic can be used in many applications, such as automotive, switch mode power supplies, and diode bridges for sine-wave rectification.

Figure 5:
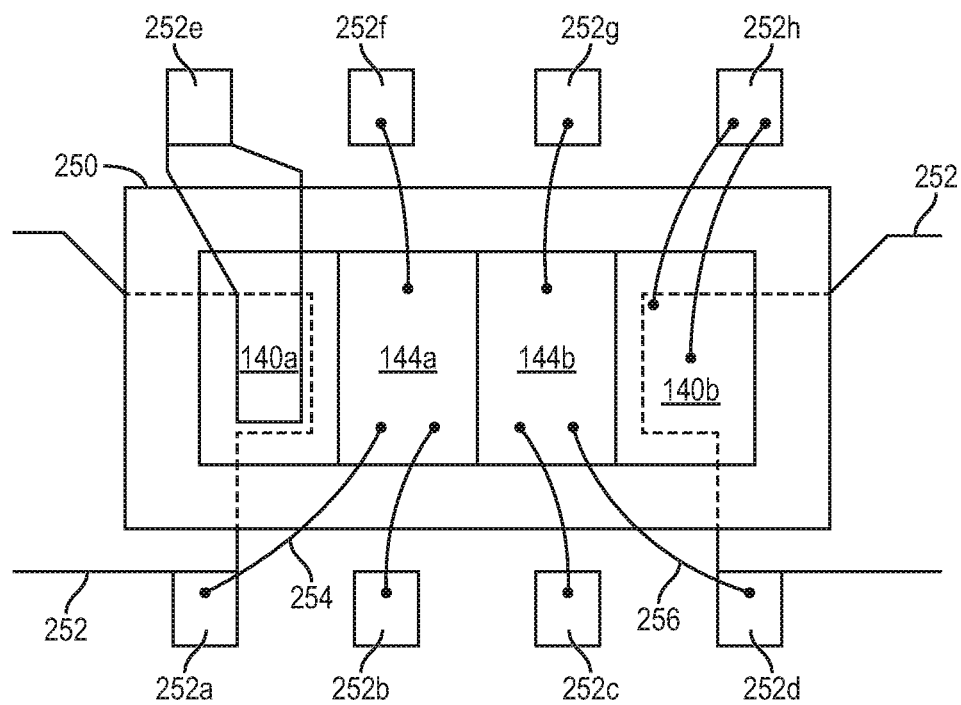
FIG. 5 illustrates the semiconductor device in a leadframe with drain sensing.

FIG. 5 illustrates semiconductor device 250 disposed in split leadframe 252 with lead fingers 252a-252h. Bond wire 254 is coupled between lead finger 252a at the drain of the power MOSFET in power region 140a to control logic in control region 144a for drain sensing. Lead fingers 252b and 252c are coupled by bond wire to control region 144a and control region 144b. Bond wire 256 is coupled between lead finger 252d at the drain of the power MOSFET in power region 140b to control logic in control region 144b for drain sensing. Lead finger 252e is coupled to the source of the power MOSFET in power region 140a. Lead fingers 252f and 252g are coupled by bond wire to control region 144a and control region 144b. Lead finger 252h is coupled by bond wire to the source of the power MOSFET in power region 140b.

Figure 6A:
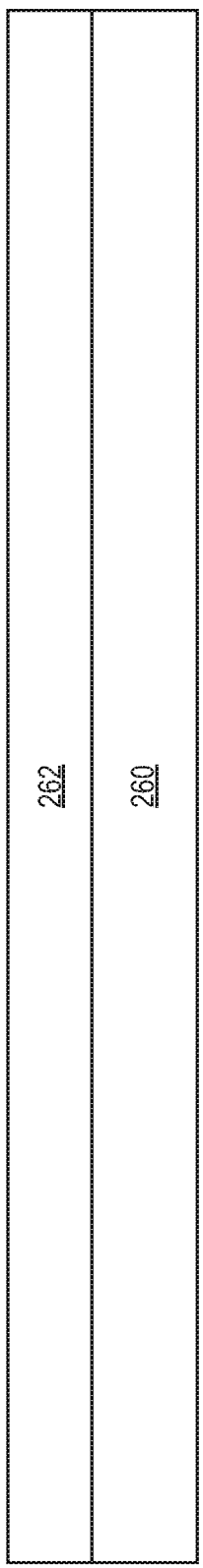
FIGS. 6a-6e illustrate forming power regions and control regions in a non-SOI substrate.
Figure 6B:
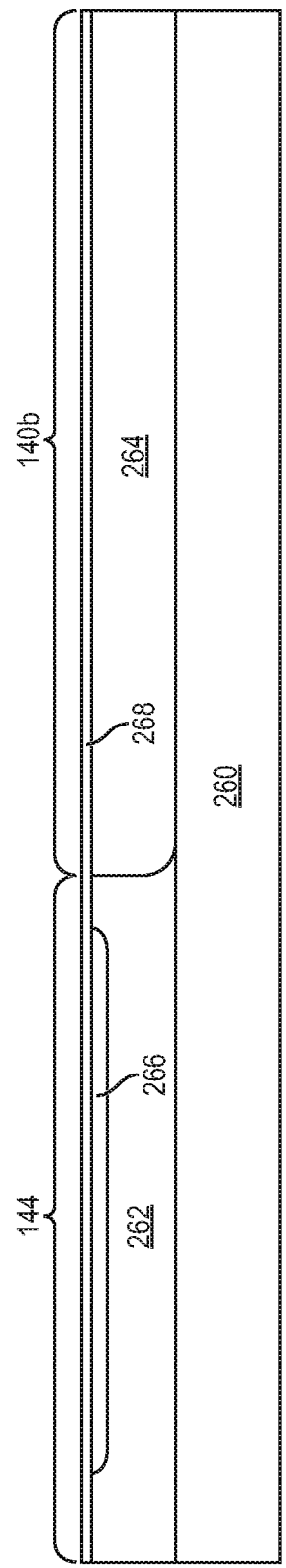

FIGS. 6a-6e illustrate an alternative embodiment of monolithically integrating isolated vertical power devices and control logic on non-SOI substrate 258. FIG. 6a shows an N-type base substrate 260 doped with donor atoms. A P-type EPI layer 262 is grown on base substrate 260. In FIG. 6b, a portion 264 of EPI layer 262 is doped with acceptor atoms to an N-type region as part of the drain connection of a power MOSFET to be formed in power region 140b. Buried layer 266 is formed in EPI layer 262 in control region 144 for isolation and low resistance path. An insulating layer 268 is formed over EPI layer 262.

Figure 6C:
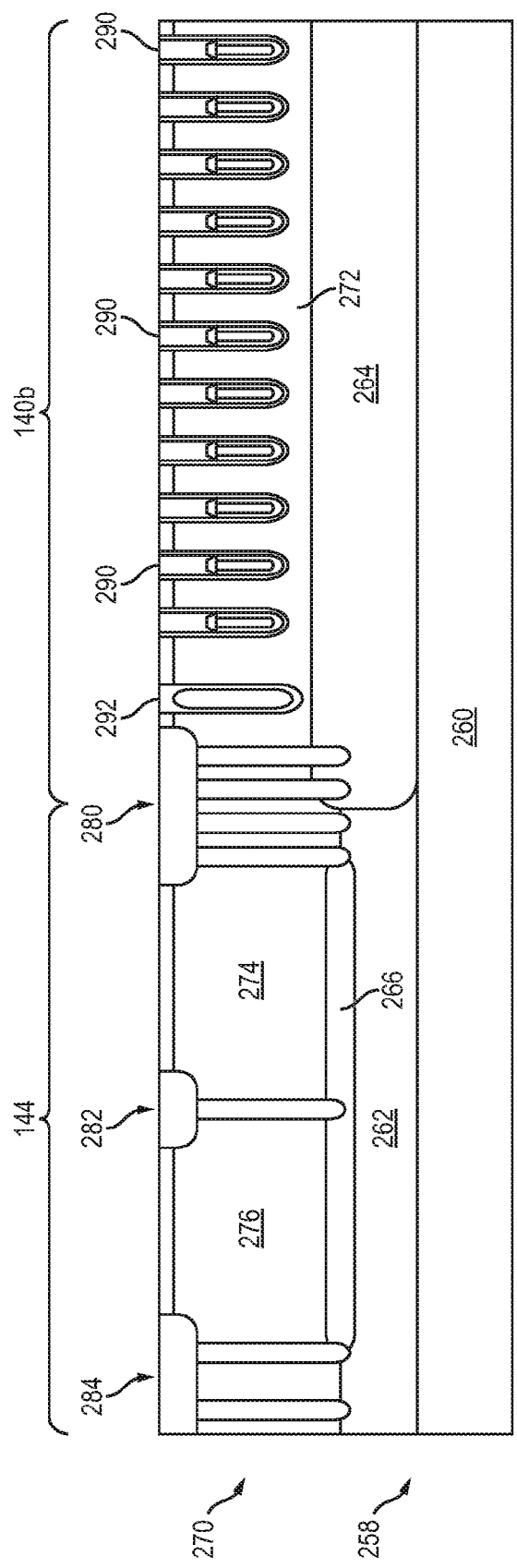

In FIG. 6c, an N-type EPI layer 270 is grown over EPI layer 262. A portion 272 of EPI layer 270 is doped with donor atoms to form a heavily doped N-type region as part of the drain terminal of power region 140b. A portion 274 of EPI layer 270 is additionally doped with donor atoms to form a heavily doped N-type region for an N-well of control region 144. A portion 276 of EPI layer 270 is doped with acceptor atoms for a P-well of control region 144. Insulation-filled trenches 280 are formed to isolate power region 140a and 140b from control region 144. Isolation trenches 280 form concentric rings around power region 140a and 140b, or otherwise extend completely between power region 140 and control region 144. Insulation-filled trenches 282 and 284 are formed to laterally isolate N-well 274 and P-well 276.

Gate structures 290 for power MOSFETs are formed within power regions 140a and 140b, similar to FIGS. 3a-3h. High voltage termination trench 292 is formed around gate structures 290, similar to FIG. 2l. MOSFETs in control region 144 and doped regions of power regions 140a and 140b, similar to FIGS. 4a-4f.

Figure 6D:
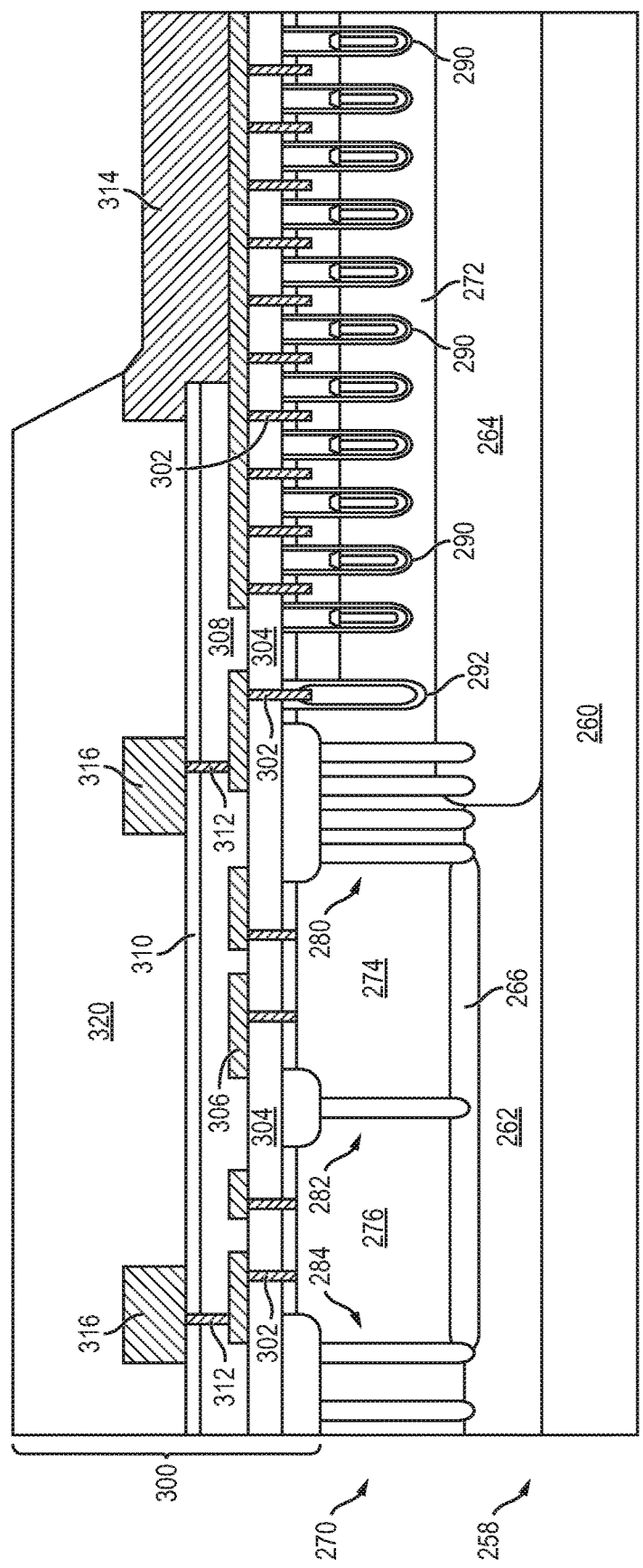

In FIG. 6d, an interconnect structure 300 includes conductive vias 302 formed through insulating layer 304 to connect to control logic transistors formed in control regions 144. Conductive layer 306 is formed over insulating layer 304 and conductive vias 302. Insulating layer 308 is formed over conductive layers 306 and insulating layer 304. Additional insulating layers like 310, conductive layer 306, and conductive via 312 can be formed for electrical interconnect and routing.

Conductive plug 314 operates as a front-side source contact through conductive vias 302 to the power MOSFET in power regions 140a and 140b and is configured for a leadframe to be coupled to the source of the power MOSFET by a clip, bond wire, or other appropriate mechanism. Drain contact 346 can be routed by bond wire or clip to the top surface of semiconductor device 340, e.g. for drain sensing. Conductive layer 316 routes electrical signals from the control logic in control regions 144a and 144b to contact pads for connection to the leadframe by wire bonding or other appropriate connection method. Insulating layer or encapsulant 320 is formed over conductive layer 316 and conductive plug 314 for environmental protection and structural integrity. An opening is etched through insulating layer 320 to expose conductive plug 314 and contact pads of conductive layer 316 for subsequent interconnect.

Figure 6E:
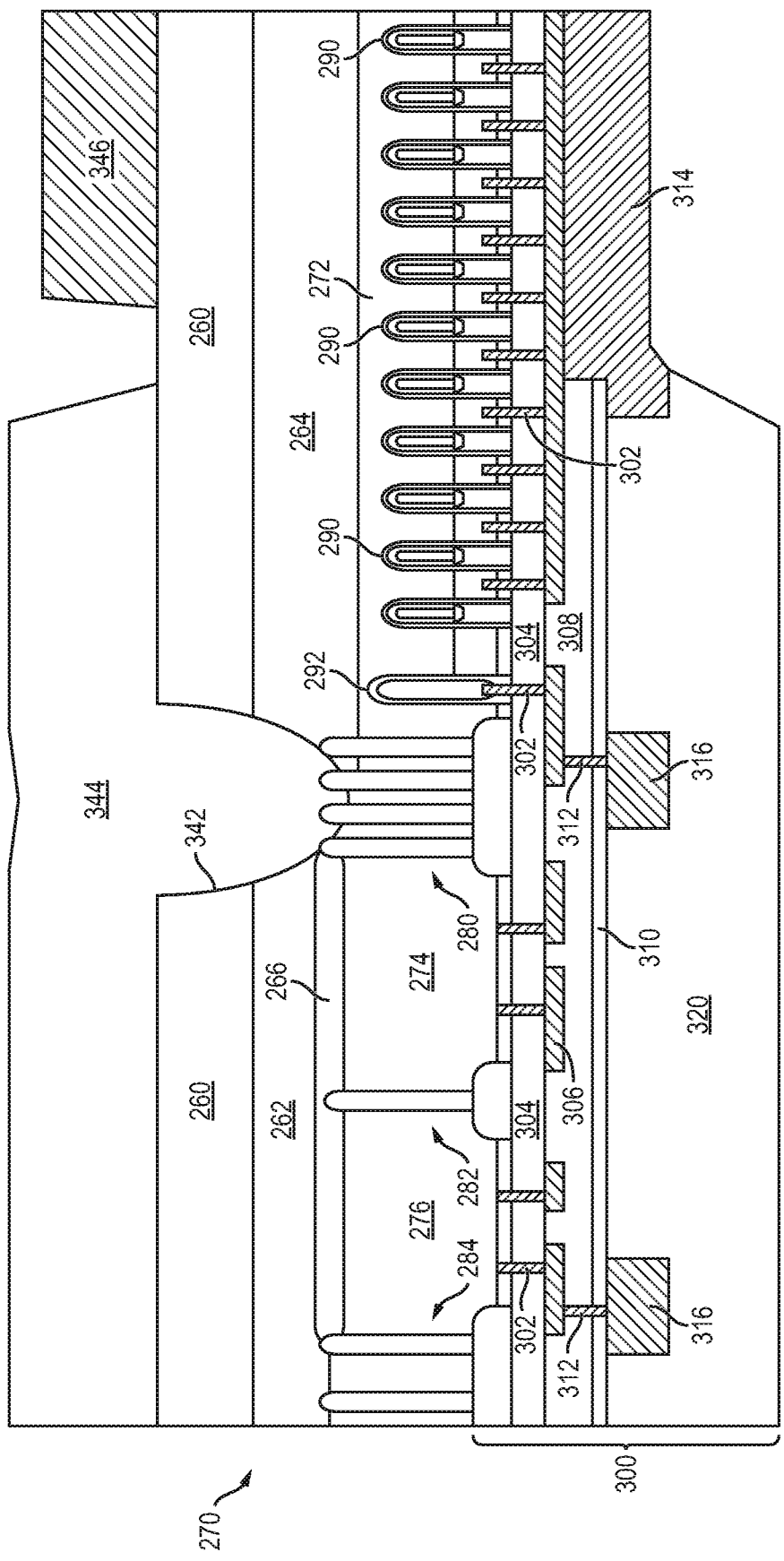

In FIG. 6e, semiconductor device 340 is shown inverted to form trench 342 using a backside etch, e.g. plasma etch. Trench 342 electrically isolates the drain terminal of a power MOSFET in power region 140a from the drain terminal of a power MOSFET in power region 140b. Trench 342 is formed extending to trenches 280 to complete the lateral isolation between power region 140 and control region 144.

Trench 342 follows the path of trenches 280. In one embodiment, trench 342 and trench 280 extend completely around each power region 140. In combination, trench 342 and trench 280 extend vertically completely through the die for complete isolation between control region 144 and power region 140. In some embodiments, trench 342 extends completely across control region 144 such that base substrate 260 and EPI layer 262 are completely removed within the footprint of control region 144. An insulating or passivation layer 344 is formed over base substrate 260 and into trench 342. Drain contact 346 is formed over base substrate 260 for backside interconnect.

Semiconductor device 340 combines one or more power devices and control logic fully isolated (source, drain, and gate of power MOSFET and control logic) in an integrated monolithic semiconductor package using an SOI substrate or non-SOI substrate. The power devices and control logic can be lateral or high density vertical trench-based semiconductor devices with vertical conduction path from active surface 110 to back surface 108 in semiconductor die 102. Conductive layers 306 and 316 provide electrical interconnect on a first major surface for control logic circuits. Conductive layer 314 provides electrical interconnect on the first major surface for the power MOSFET, e.g. source connection. Conductive layer 346 provides electrical interconnect on a second major surface for the power MOSFET, e.g. drain connection. The drain of the power MOSFET can be routed to the first major surface for drain sensing by the control logic, see FIG. 5. Semiconductor device 340 provides a flexible platform for different voltages based on vertical thickness and/or trench depth. Semiconductor device 340 containing one or more isolated power devices and associated control logic can be used in many applications, such as automotive, switch mode power supplies, and diode bridges for sine-wave rectification.

Figure 7A:
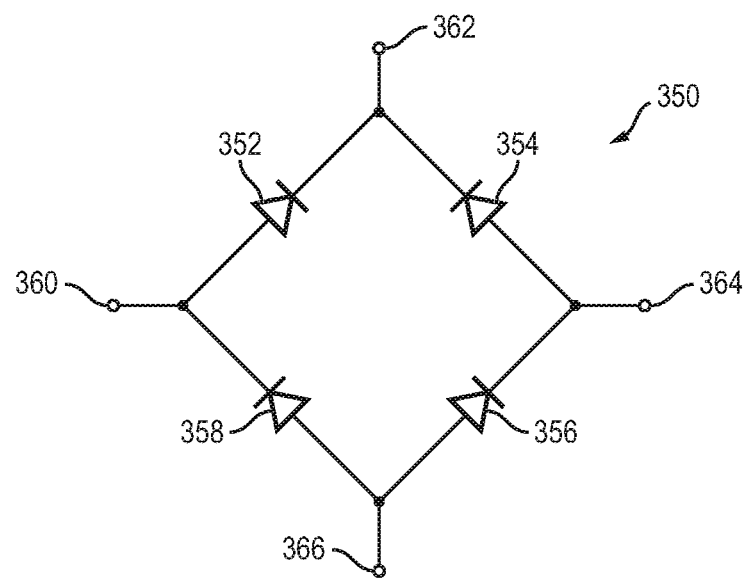
FIGS. 7a-7b illustrate the semiconductor device in a diode bridge configuration.
Figure 7B:
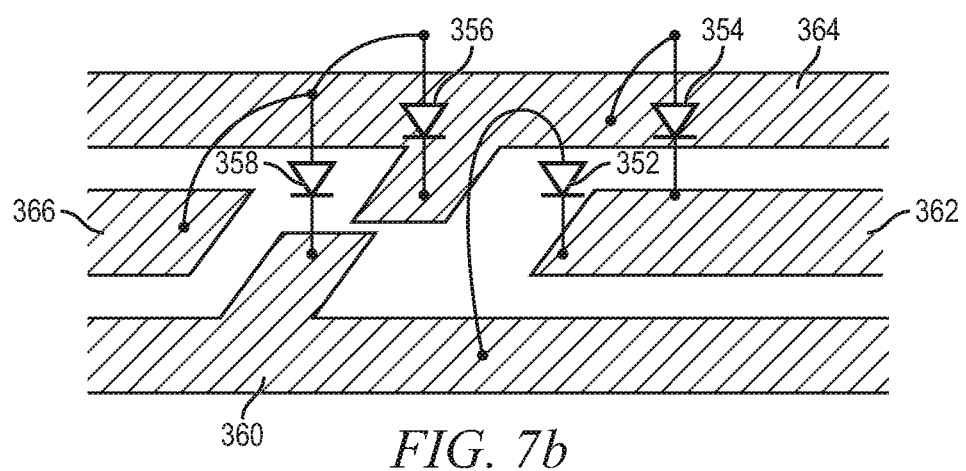

FIGS. 7a and 7b illustrate diode bridge 350 for sine-wave rectification, including diodes 352, 354, 356, and 358, formed in four power regions 140. Diode 352 is coupled between conductive layer 360 and conductive layer 362. Diode 354 is coupled between conductive layer 362 and conductive layer 364. Diode 356 is coupled between conductive layer 364 and conductive layer 366. Diode 358 is coupled between conductive layer 366 and conductive layer 360.

While one or more embodiments have been illustrated and described in detail, the skilled artisan will appreciate that modifications and adaptations to those embodiments may be made without departing from the scope of the present disclosure.

What is claimed:

1. A semiconductor device, comprising:
   a substrate including a semiconductor wafer, a buried oxide layer over the semiconductor wafer, and a semiconductor material over the buried oxide layer;
   an oxide along a sidewall of the semiconductor material;
   an epitaxial layer within an opening of the substrate that extends through the semiconductor material and the buried oxide layer, wherein the epitaxial layer overlies the semiconductor wafer;
   a first vertical power semiconductor device including a portion of the epitaxial layer;
   a first control circuit in the semiconductor material of the substrate to control the first vertical power semiconductor device, wherein the first control circuit is spaced apart from the epitaxial layer; and
   a first isolation trench between the first vertical power semiconductor device and the first control circuit, and between the oxide and the epitaxial layer.

2. The semiconductor device of claim 1, further including a second isolation trench in the semiconductor material to isolate the first control circuit from a second control circuit.

3. The semiconductor device of claim 1, wherein the buried oxide layer extends under the first control circuit.

4. The semiconductor device of claim 3, further including a second trench along a bottom surface of the substrate opposite a top surface of the substrate and extending through the semiconductor wafer to the buried oxide layer.

5. The semiconductor device of claim 4, wherein the second trench surrounds the first vertical power semiconductor device.

6. The semiconductor device of claim 4, further including a second power semiconductor device in the substrate, wherein the second trench isolates the first vertical power semiconductor device from the second power semiconductor device.

7. The semiconductor device of claim 4, further comprising an insulating layer within the second trench, wherein the second trench separates the semiconductor wafer into a control portion associated with the first control circuit and a power semiconductor device portion associated with the first vertical power semiconductor device.

8. The semiconductor device of claim 7, further comprising a drain contact that contacts the power semiconductor device portion of the semiconductor wafer.

9. The semiconductor device of claim 1, wherein a surface of the semiconductor material is coplanar with a surface of the epitaxial layer.

10. A monolithic semiconductor device, comprising:
    a substrate including a semiconductor material along a top surface of the substrate, a semiconductor wafer along a bottom surface of the substrate, and a buried oxide layer between the semiconductor wafer and the semiconductor material;
    an oxide along a sidewall of the semiconductor material and the buried oxide layer;
    an epitaxial layer spaced apart from the semiconductor material and the buried oxide layer of the substrate;
    a power semiconductor device including a portion within the epitaxial layer;
    a first control circuit within the semiconductor material; and
    a first isolation trench between the epitaxial layer and the semiconductor material of the substrate.

11. The monolithic semiconductor device of claim 10, further including a second isolation trench in the semiconductor wafer to isolate the first control circuit from a second control circuit.

12. The monolithic semiconductor device of claim 10, further including an interconnect structure over the power semiconductor device and first control circuit.

13. The monolithic semiconductor device of claim 10, wherein the substrate is a silicon-on-insulator substrate.

14. The monolithic semiconductor device of claim 10, wherein a surface of the semiconductor material is coplanar with a surface of the epitaxial layer.

15. The monolithic semiconductor device of claim 10, wherein the epitaxial layer is disposed within an opening of the semiconductor material.

16. The monolithic semiconductor device of claim 10, wherein the power semiconductor device is a vertical power semiconductor device.

17. The monolithic semiconductor device of claim 16, further comprising a gate electrode of the power semiconductor device, wherein the gate electrode is disposed within a gate trench that extends into the epitaxial layer.

18. The monolithic semiconductor device of claim 10, wherein the first control circuit is configured to sense a voltage of the power semiconductor device.

19. The monolithic semiconductor device of claim 10, wherein the buried oxide layer is disposed between the first control circuit and the semiconductor wafer.

20. A semiconductor device, comprising:
- a substrate including a semiconductor material along a top surface of the substrate and a semiconductor wafer along a bottom surface of the substrate;
- an epitaxial layer spaced apart from the semiconductor material;
- a power semiconductor device including a portion within the epitaxial layer;
- a control circuit within the semiconductor material;
- a first isolation trench between the epitaxial layer and the semiconductor material of the substrate; and
- a second isolation trench along a bottom surface of the substrate opposite the top surface and extending through the semiconductor wafer, wherein the second isolation trench includes an insulating layer and separates the semiconductor wafer into a control portion associated with the control circuit and a power semiconductor device portion associated with the power semiconductor device.

* * * * *